United States Patent
Kawakami et al.

(10) Patent No.: US 8,493,152 B2
(45) Date of Patent: Jul. 23, 2013

(54) POWER AMPLIFIER

(75) Inventors: Tsuyoshi Kawakami, Tokyo (JP);
Akihiko Furukawa, Tokyo (JP); Satoshi Yamakawa, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/621,096

(22) Filed: Sep. 15, 2012

(65) Prior Publication Data
US 2013/0009709 A1 Jan. 10, 2013

Related U.S. Application Data

(63) Continuation of application No. 12/882,592, filed on Sep. 15, 2010, now Pat. No. 8,314,658.

(30) Foreign Application Priority Data

Sep. 16, 2009 (JP) .................................. 2009-214308

(51) Int. Cl.
*H03F 3/68* (2006.01)
(52) U.S. Cl.
USPC ...................................... 330/295; 330/124 R
(58) Field of Classification Search
USPC ................. 330/295, 124 R, 84, 252–261, 301
See application file for complete search history.

(56) References Cited

U.S. PATENT DOCUMENTS

| 7,612,612 B2 | 11/2009 | Staszewski et al. |
| 2009/0002071 A1 | 1/2009 | Aoki et al. |

FOREIGN PATENT DOCUMENTS

JP 2005-503679 A 2/2005

OTHER PUBLICATIONS

Japanese Office Action, and English translation thereof, issued in Japanese Patent Application No. 2009-214308 dated Nov. 27, 2012.
Pfeiffer, U.P. et al. "A 23-dBm 60-GHz Distributed Active Transformer in a Silicon Process Technology". IEEE Transactions on Microwave Theory and Techniques. vol. 55, No. 5. May 2007.

*Primary Examiner* — Hieu Nguyen
(74) *Attorney, Agent, or Firm* — McDermott Will & Emery

(57) ABSTRACT

A power amplifier comprises a plurality of primary inductors provided on a substrate in a circular geometry as a whole; a plurality of amplifier pairs; a secondary inductor; and a connection wiring. Each amplifier pair is coupled to two ends of a corresponding primary inductor, and amplifies and output to the corresponding primary inductor a pair of first and second signals given as differential input signals, respectively. The secondary inductor is provided adjacent to the primary inductors in a circular geometry, further combines and outputs signals made by combining first and second signals in each primary inductor. The connection wiring is provided inside the primary inductors on the substrate and electrically couples middle points of respective primary inductors with each other.

8 Claims, 14 Drawing Sheets

|  | TURN RATIO 1:m, ONE STAGE | TURN RATIO 1:1, n STAGES |
|---|---|---|
| OUTPUT POWER (W) | 2 | 2/n |
| LOAD IMPEDANCE ($\Omega$) | $25/m^2$ | $25/n$ |
| DRAIN VOLTAGE AMPLITUDE (V) | $10/m$ | $10/n$ |
| DRAIN CURRENT AMPLITUDE (A) | $0.4m$ | $0.4$ |

|  | WITHOUT CONNECTION WIRING | WITH CONNECTION WIRING |
|---|---|---|
| INDUCTANCE OF PRIMARY INDUCTOR (nH) | 0.772 | 0.772 |
| INDUCTANCE OF SECONDARY INDUCTOR (nH) | 4.290 | 4.275 |
| TURN RATIO PER TRANSFORMER | 2.778 | 2.769 |
| INSERTION LOSS DURING MATCHING AT 900 MHz (dB) | 0.813 | 0.845 |

POWER AMPLIFIER

CROSS-REFERENCE TO RELATED APPLICATIONS

This is a Continuation Application of U.S. application Ser. No. 12/882,592, filed on Sep. 15, 2010 now U.S. Pat. No. 8,314,658, which claims the benefit of Japanese Patent Application No. 2009-214308 filed on Sep. 16, 2009, the disclosures of which Applications are incorporated herein by reference in its entirety.

BACKGROUND OF THE INVENTION

The present invention relates to a power amplifier which amplifies an input signal to a required voltage level.

In communication devices such as a cell phone unit, to reduce areas occupied by built-in components such as a power amplifier and to reduce their costs are critical problems to be solved. For example, Japanese Unexamined Patent Application Publication No. 2005-503679 (Patent Document 1) discloses a distributed power amplifier which efficiently and economically amplifies a radio-frequency signal.

The power amplifier of Patent Document 1 comprises a plurality of push-pull amplifiers interconnected in a circular geometry. An input signal of equal magnitude and opposite phase is inputted to adjacent amplification devices of each of the push-pull amplifiers. A closed loop to which the push-pull amplifiers are coupled functions as a primary winding of a transformer. By further having a secondary winding that matches the geometry of the primary winding, the power amplifier efficiently combines the output power of the individual push-pull amplifiers.

[Patent Document 1] Japanese Unexamined Patent Application Publication (Translation of PCT Application) No. 2005-503679

SUMMARY OF THE INVENTION

As in Patent Document 1, for the power amplifier which combines the output power of the amplifier pairs performing differential operation with use of a transfer, it is requisite that the differential operation of each amplifier pair is performed ideally. Therefore, because of the phase shift in the differential input signals, variation in characteristics of the amplifiers, non-symmetrical feature of the layout, etc., a shift is caused in a differential operation of the whole power amplifier. As a result, a level of an output signal of the power amplifier is lowered.

An object of the present invention is to provide a power amplifier which can suppress a reduction in output which might be caused by a shift in a differential operation of the amplifier pairs, in a power amplifier which combines the output power of a plurality of amplifier pairs with use of a transformer.

To sum up, according to the present invention, the power amplifier comprises: a plurality of primary inductors arranged as a whole in a circular geometry on a substrate; a plurality of amplifier pairs; secondary inductors; and a connection wiring. The amplifier pairs are provided corresponding to the primary inductors, respectively. First and second amplifiers forming each of the amplifier pairs are coupled to two ends of the corresponding primary inductor, respectively, amplify each of a pair of first and second signals given as differential input signals, and output them to the corresponding primary inductor. The second inductor with one turn or multiple turns is arranged adjacent to the primary inductors in a circular geometry and, by being magnetically coupled to the primary inductors, the secondary inductor further combines signals made by combining the first and second signals at each of the primary inductors and output them. The connection wiring is provided inside the primary inductors on the substrate and electrically couples middle points of the primary inductors, respectively, with each other. In this regard, the middle point is a point which is on the primary inductor and a point at the same distance from two ends of the primary inductor.

According to the present invention, by providing the connection wiring for electrically coupling the middle points of the primary inductors with each other, the shift in the differential operation of each amplifier pairs can be suppressed. As a result of this, the reduction in output of the power amplifier can be suppressed.

DETAILED DESCRIPTION OF THE PREFERRED EMBODIMENTS

Figure 1:
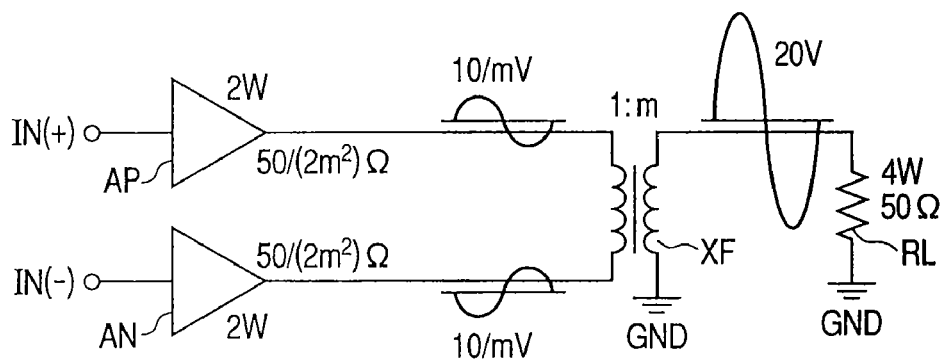
FIG. 1 is a circuit diagram showing a transformer-based amplifier using a transformer having a turn ratio of 1:m.

Now, with reference to the drawings, embodiments of the present invention will be described in detail. Also, in all of the drawings for illustrating the embodiments, the same or corresponding parts are identified by the same reference characters and repeated explanations thereof will be omitted.

Embodiment 1

Principle of Transformer-based Amplifier

First, the principle of a transformer-based power amplifier used as foundation for the invention will be explained.

In communication devices, such as a cell phone unit, a CMOS (Complementary Metal-Oxide Semiconductor) transistor (complementary isolated gate field-effect transistor) is used as a transistor for many of built-in components.

However, as process nodes become smaller in size, the breakdown voltage between source and drain of CMOS is decreasing. Therefore, it has become difficult to produce analogue parts such as a power amplifier with use of a CMOS. For example, the breakdown voltage between a source and a drain of a common minute CMOS is several volts. On the other hand, as in a transmitting part of a cell phone unit, when an electric power of several watts is outputted, if it is outputted to a load of 50Ω directly from the drain, an AC voltage easily exceeding the breakdown voltage between the source and the drain is applied to the drain. To be specific, when the electric power of 4 W is outputted from a MOS transistor of the source ground, supposing that the load of 50Ω is directly coupled to the drain, the amplitude (zero to peak) of the drain voltage is 20V.

Therefore, in order to realize a power amplifier with use of a minute CMOS, it is necessary to suppress the amplitude of the drain voltage by a passive-element circuit produced in a CMOS process. Synthesizing of differential signals and impedance conversion are effective for suppressing the amplitude of the drain voltage.

In a power amplifier of a differential configuration, a single-phase signal with a double amplitude is obtained by combining the differential signals which are two signals of the opposite phases but of the same amplitude by a balun (balanced to unbalanced line transformer). Therefore, when compared at the same output power, the drain voltage in the differential configuration can be half the drain voltage in the single-phase configuration.

In impedance conversion, using an LC circuit (a circuit comprising an inductor and a capacitor) etc., an output impedance of the transistor is reduced and the drain voltage is reduced. Through impedance conversion to 1/N, the drain voltage can be $(1/N)^{1/2}$ of what it used to be. However, since the power output of the transistor is constant, the drain electric current of the transistor is multiplied by $N^{1/2}$.

A transformer is a passive element with the function of both the synthesizing of the differential signals and the impedance conversion. Since a transformer is producible using a standard metal thin-film wiring layer, the whole power amplifier can be made as one chip by a CMOS process. Thus, a transformer produced with use of a metal thin-film wiring layer is called an on-chip transformer.

A transformer-based amplifier is a power amplifier which combines the output power of a pair of MOS transistors (differential pair) performing differential operation by a transformer. Since the transformer-based power amplifier is of a differential configuration, the amplifier itself has an effect of suppressing a drain voltage amplitude. However, with use of a circuit configuration, the drain voltage amplitude can be further suppressed. There are two approaches. One is a method (see FIG. 1) to convert impedance by changing a turn ratio of a transformer, namely, an inductance ratio. The other is a method (see FIG. 2) to couple transformer-based power amplifiers in multiple stages through a secondary inductor of the transformer to separate a load and an electric power.

FIG. 1 is a circuit diagram showing a transformer-based amplifier with use of a transformer having a turn ratio of 1:m. Referring to FIG. 1, the transformer-based amplifier comprises a transformer XF having a turn ratio of 1:m and an amplifier pair AP and AN (also called a "differential pair") coupled to two ends of a primary winding of the transformer XF. A load resistance RL is coupled to a secondary winding of the transformer XF.

Each of the amplifier pair AP and AN comprises, for example, an NMOS (N-Channel Metal Oxide Semiconductor) transistor (N-channel insulated gate field-effect transistor) which is source grounded. Hereafter, the amplifier pair of AP and AN is also referred to as the "transistor pair AP and AN." Two differential signals IN(+) and IN(−) with the same amplitude and opposite phases (first and second signals) are inputted to gates of the transistor pair AP and AN. In the present specification, the signal IN(+) is also called the "non-inverted signal IN(+)" and the signal IN(−) is also called the "inverted signal IN(−)."

In the circuit configuration of FIG. 1, with use of the transformer XF having the turn ratio of 1:m, a drain voltage of the transistor can be set to 1/(2m). For example, when the output of the transformer-based amplifier is 4 W and the load resistance RL is 50Ω, the voltage amplitude (zero to peak) of the transformer XF on the secondary side is 20V. In this case, if the load resistance RL is directly coupled to the drain of the NMOS transistor, the voltage amplitude of the drain is 20V. However, when the transistors are coupled through the transformer XF, the voltage amplitude of the drain of each of the transistors AP and AN becomes 10/m[V]. At this time, the magnitude of the load resistance RL converted to an output power of each of the transistors AP and AN is $50/(2 m^2)[\Omega]$.

Figure 2:
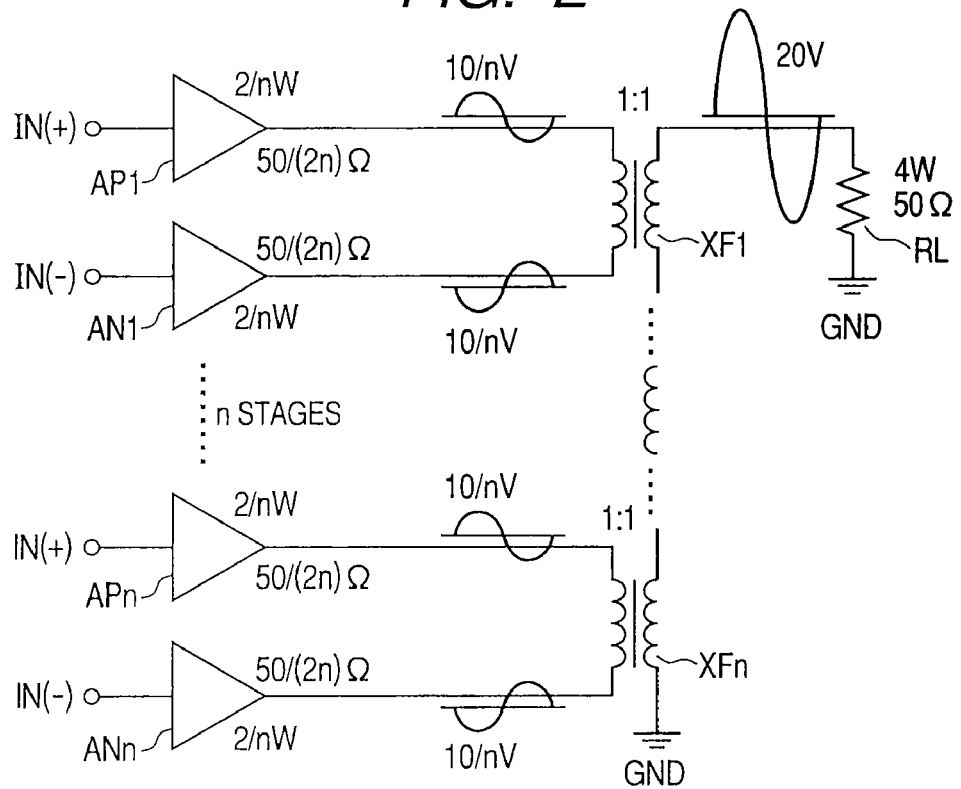
FIG. 2 is a circuit diagram showing a transformer-based amplifier in which transformers in n stages each having a turn ratio of 1:1 are coupled.

FIG. 2 is a circuit diagram showing a transformer-based amplifier in which transformers each having a turn ratio of 1:1 are coupled in n stages. Referring to FIG. 2, the transformer-based amplifier comprises: n (where n is an integer of two or greater) transformers XF1 to XFn each having a turn ratio of 1:1, and n transistor pairs AP1, AN1 to APn, and ANn provided, respectively, to the transformers XF1 to XFn. The transistors AP and AN of each pair are coupled, respectively, to two ends of the primary winding of the corresponding transformer XF. The secondary windings of the transformers XF1 to XFn are coupled in series with respect to the load resistance RL.

According to the circuit configuration of FIG. 2, by coupling the transformers XF each having a turn ratio of 1:1 in n stages, an output voltage of the transistor can be set to 1/(2n). For example, when an output of the transformer-based amplifier is 4 W and the load resistance RL is 50Ω, an output voltage amplitude (zero to peak) of the transformers XF1 to XFn whose secondary sides are coupled in series is 20V. In this case, the voltage amplitude of the drain of each of the transistors AP and AN becomes 10/n[V]. At this time, the magnitude (load impedance) of the load resistance RL converted to the primary side of each transformer is 50/(2n) [Ω]

Figures 3, 4:
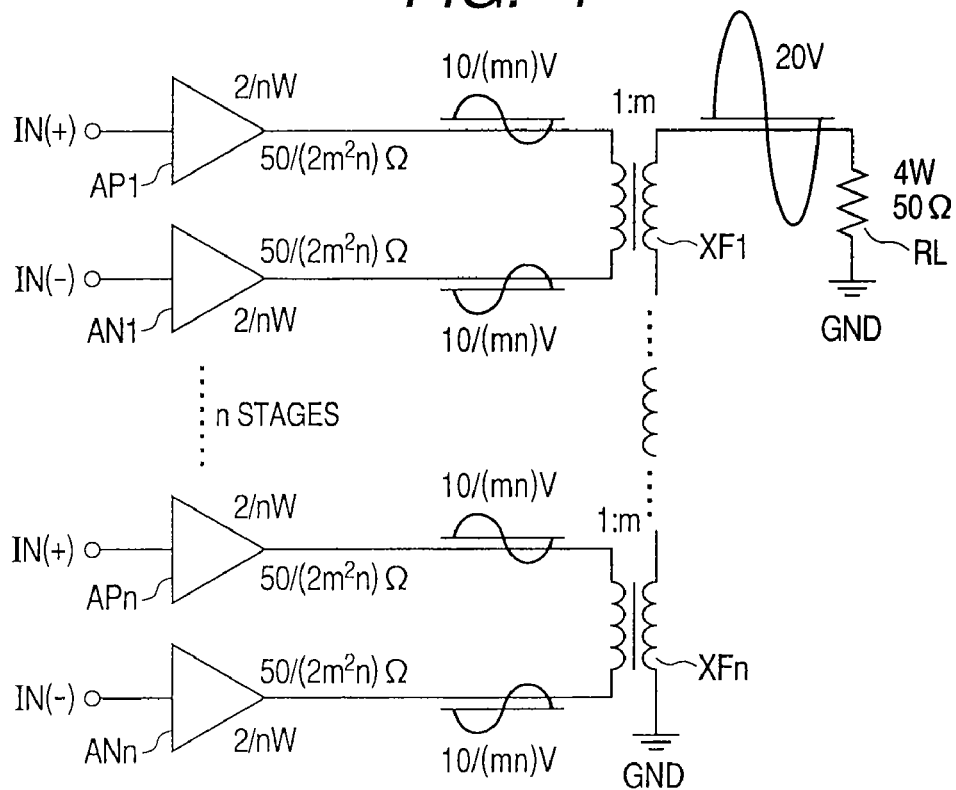
FIG. 3 is a table showing output per transistor in the transformer-based amplifiers in FIGS. 1 and 2.
FIG. 4 is a circuit diagram showing a transfer-based amplifier in which transformers in n stages each having a turn ratio of 1:m are coupled.

FIG. 3 is a table showing an output per transistor in the transformer-based amplifier of FIGS. 1 and 2. FIG. 3 shows an output voltage (W), a load impedance (Ω), a drain voltage amplitude (V), and a drain current amplitude (A) per transistor when a sine wave of 4 W is outputted from the transformed-based amplifier to a load of 50 Ω.

As in the circuit configuration of FIG. 2, when the turn ratio of the transformer is 1:1, its characteristic is that the drain current amplitude does not depend on the number of stages n. A CMOS has a parasitic bipolar transistor therein. Therefore, it comes to have a parasitic bipolar effect caused by an excessive drain current. Thus, the circuit configuration of FIG. 2 is more advantageous than the circuit configuration of FIG. 1.

FIG. 4 is a circuit diagram showing a transformer-based amplifier in which transformers each having a turn ratio of 1:m are coupled in n stages. Drain voltages are suppressed by different mechanisms in the circuit configuration of FIG. 1 and in the circuit configuration of FIG. 2. Therefore, it is possible to use both of them at the same time. The circuit configuration of FIG. 4 is made by allowing the turn ratio of each of the transformers XF1 to XFn to be 1:m in the circuit configuration of FIG. 2. Thus, when the transformers each having a turn ratio of 1:m are coupled in n stages, the drain voltage of each transistor becomes 1/(2 nm).

For example, when a sine wave of 4 W is outputted from the transformer-based amplifier of FIG. 4 to a load of 50Ω, the drain voltage per transistor becomes 10/(mn) [V]. At this time, a load impedance per transistor is $50/(2 m^2 n)[\Omega]$. Therefore, the drain current amplitude per transistor is 0.4 m[A], and it does not depend on the number of stages n as in the case of FIG. 2. The drain current amplitude increases according to the value of "m." However, since the drain voltage is suppressed by using two different mechanisms, the transformer-based amplifier of FIG. 4 can be effective means for achieving a power amplifier of several-watt level output by a minute CMOS process.

[Configuration of Power Amplifier 110 of Embodiment 1]

As shown in FIG. 2 or 4, when using two or more transformers, an area occupied by the transformers is multiplied by n in a layout where the transformers are simply arranged. Therefore, the chip area of the whole power amplifier also increases, which is against the idea of making the occupancy area smaller by CMOS and further reducing the manufacturing cost.

According to the power amplifier of Embodiment 1, by devising a layout of an on-chip transformer, an increase in its occupancy area is suppressed. To be specific, according to the power amplifier of Embodiment 1, each of the primary inductor and the secondary inductor of the transformer is provided in a slab-like form. Then, such primary and secondary inductors are arranged in a circular geometry so that the loss is suppressed and the occupancy area is reduced. The turn ratio becomes 1:1.

Figure 5:
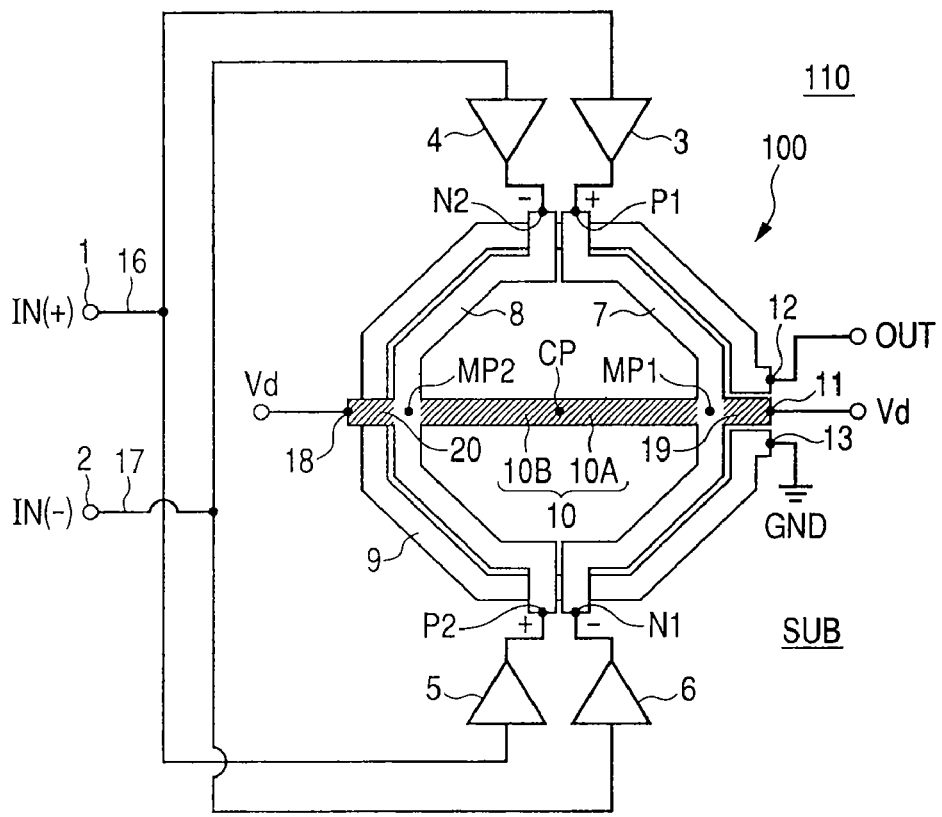
FIG. 5 shows a configuration of a power amplifier 110 according to Embodiment 1 of the present invention.

FIG. 5 shows a configuration of a power amplifier 110 according to Embodiment 1 of the present invention. Referring to FIG. 5, the power amplifier 110 comprises input terminals 1 and 2, amplifiers 3 to 6, and a slab-like transformer 100, formed on a substrate SUB. The power amplifier 110 of FIG. 5 corresponds to the transformer-based amplifier of FIG. 2 in which n=2 and the turn ratio is 1:1.

The input terminals 1 and 2 receive differential input signals. A non-inverted signal IN(+) inputted from the input terminal 1 is amplified by the amplifiers 3 and 5, and an inverted signal IN(−) inputted from the input terminal 2 is amplified by the amplifiers 4 and 6. The amplifiers 3 to 6 are of the same configuration, and are usually comprised of MOS transistors of the source ground. Hereafter, the amplifiers 3 to 6 are also referred to as the "transistors 3 to 6." The differential signals amplified by the transistors 3 to 6 are inputted to the transformer 100.

The transformer 100 comprises: two primary inductors 7 and 8 of ½ turn (half of one turn) arranged in a circular geometry as a whole; a secondary inductor 9 of one turn adjacent to the primary inductor; a connection wiring 10 for coupling middle points of the primary inductors 7 and 8; and wiring parts 19 and 20 drawn (pulled) out, respectively, from the middle points MP1 and MP2 of the primary inductors 7 and 8. In FIG. 5, hatching is used for the connection wiring 10 and the wiring parts 19 and 20 to make the drawing easier to see. In this regard, the middle point of the primary inductor is a point on the primary inductor and also a point at the same distance from two ends of the primary inductor.

Except for the crossing parts, the transformer 100 of FIG. 5 is made with use of the same wiring layer. In this regard, it is preferable in a CMOS process to use the uppermost wiring layer which has the lowest resistance. Needless to say, it is also possible to form the on-chip transformer by laminating inductors made with use of different wiring layers. This holds true of transformers of Embodiments 2 and 3 to be described later.

As shown in FIG. 5, output nodes of the transistors 3 and 6 are coupled to two ends P1 and N1 of the primary inductor 7, respectively. Further, output nodes of the transistors 5 and 4 are coupled to two ends P2 and N2 of the primary inductor 8, respectively. The transistors 3 and 4 are arranged on the substrate adjacent to each other outside the secondary inductor 9, and the transistors 5 and 6 are arranged on the substrate adjacent to each other outside the secondary inductor 9.

Drain bias voltages (drive voltages) are applied to terminals (Vd terminals) 11 and 18, of the wiring parts 19 and 20, for drain bias application. Accordingly, the drain bias voltages are supplied to the transistors 3 to 6.

By being magnetically coupled to the primary inductors 7 and 8, the secondary inductor 9 further combines a signal (IN(+)−IN(−)) made by combining the signals IN(+) and IN(−) in the primary inductor 7 with a signal (IN(+)−IN(−)) made by combining the signals IN(+) and IN(−) in the primary inductor 8. The combined signal is outputted as a single-phase output signal OUT, by grounding one terminal 13 of the secondary inductor 9, from the other terminal 12.

Figure 6:
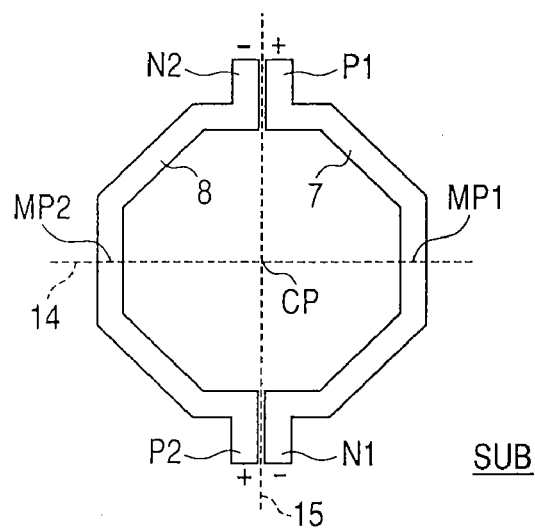
FIG. 6 is a plan view showing a layout of primary inductors 7 and 8 of the power amplifier 110 of FIG. 5.

FIG. 6 is a plan view showing a layout of the primary inductors 7 and 8 of the power amplifier 110 of FIG. 5. With reference to FIG. 6, when regarding the primary inductors 7 and 8 as one geometry and focusing on an entire profile, the primary inductors 7 and 8 are of two-turn rotational symmetry with respect to a central axis which passes through a central point CP on a substrate and is perpendicular to the substrate. Furthermore, the primary inductors 7 and 8 are mirror-symmetrical to respective symmetrical planes 14 and 15 containing the central axis of the rotational symmetry. In this regard, the plane 14 of mirror symmetry passes through the middle point MP1 of the primary inductor 7 and the middle point MP2 of the primary inductor 8.

The connection wiring 10 of FIG. 5 is arranged along the plane 14 of mirror symmetry of FIG. 6. To be specific, the connection wiring 10 comprises: a first wiring part 10A for coupling the central point CP with the middle point MP1 of the primary inductor 7; and a second wiring part 10B for coupling the central point CP with the middle point MP2 of the primary inductor 8. Since drain bias voltages of the same magnitude are applied to the Vd terminals 11 and 18, a DC current (direct current) can be prevented from flowing in the connection wiring 10 by arranging the connection wiring 10 as above.

Figure 7:
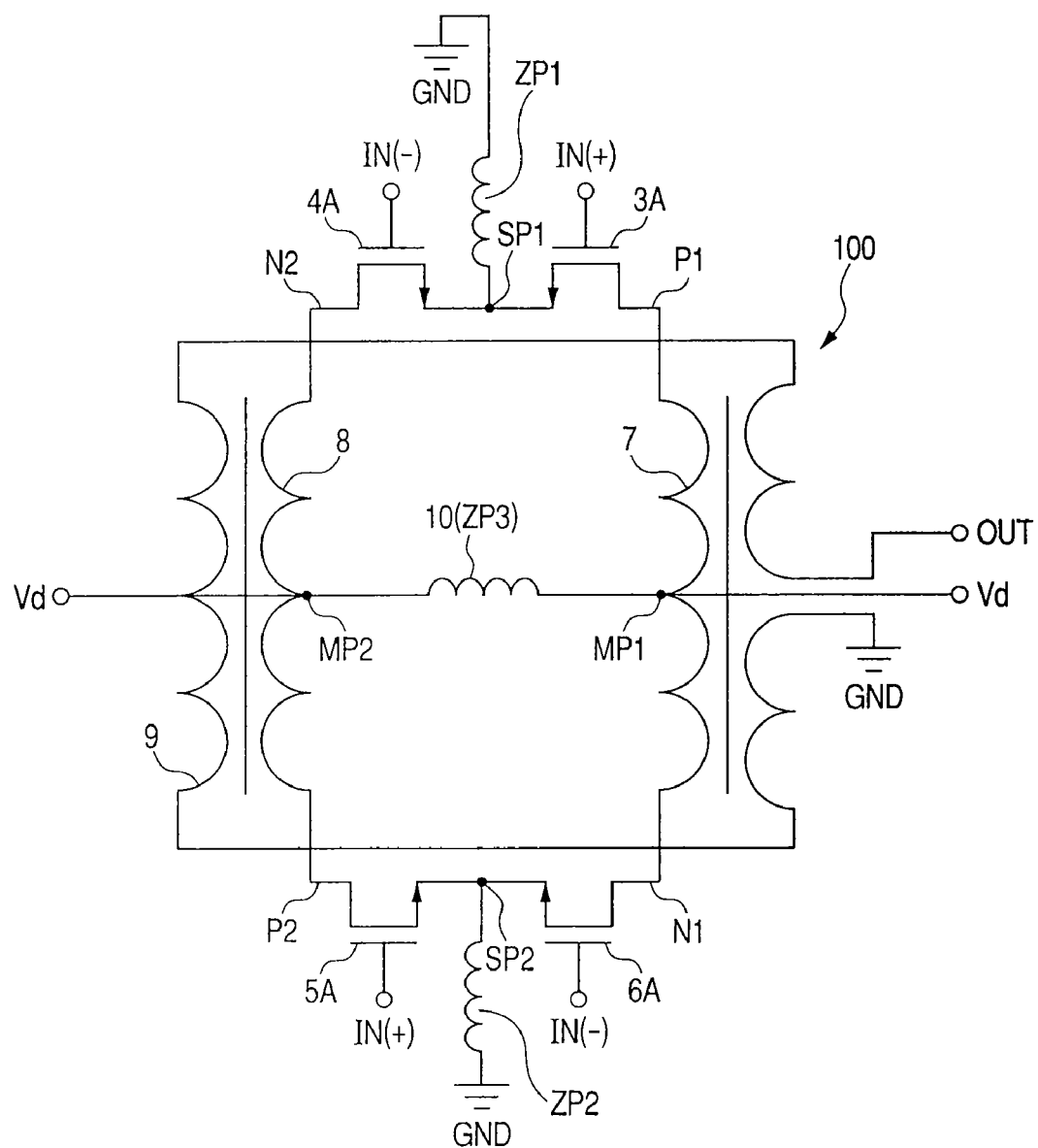
FIG. 7 shows an equalizing circuit of the power amplifier 110 of FIG. 5.

FIG. 7 is a diagram showing an equalizing circuit of the power amplifier of FIG. 5. Referring to FIG. 7, the amplifiers 3 to 6 of FIG. 5 comprise NMOS transistors 3A to 6A, respectively. The drain bias voltages of the NMOS transistors 3A to 6A are applied through the wiring drawn out from the middle points MP1 and MP2 of the primary inductors 7 and 8. A source of the transistor 3A is coupled to a source of the adjacent transistor 4A. A connection node SP1 of the transistors 3A and 4A is coupled to a ground node GND by a bonding wire etc. A source of the transistor 5A is coupled to a source of the adjacent transistor 6A. A connection node SP2 of the transistors 5A and 6A is coupled to the ground node GND by a bonding wire etc.

In an ideal case, that is, when the input signals IN(+) and IN(−) are of the same amplitude and of opposite phases, the NMOS transistors 3A to 6A are of the same configuration, and the mirror symmetry shown in FIG. 6 is maintained, either of the middle points MP1 and MP2 of the primary inductors 7 and 8 and the connection nodes SP1 and SP2 between the adjacent transistors becomes a virtual AC ground. Since being virtually AC grounded, it is not necessary to attach external AC cut parts such as choke coils to the Vd terminals 11 and 18. Furthermore, the differential input signals IN(+) and IN(−) are not affected by parasitic impedances ZP1 and ZP2 caused by the bonding wire provided between the connection nodes SP1 and SP2 and the ground node GND. In this regard, the parasitic impedance means a combined impedance of a parasitic resistance and a parasitic inductance. Moreover, although a parasitic impedance ZP3 exists also in the connection wiring 10, since the plane 14 of mirror symmetry of the primary inductors 7 and 8 as a whole is a virtual AC ground in the ideal case, the connection wiring 10 hardly affects the high-frequency characteristic of the transformer 100.

[Effect of Connection Wiring 10]

Now, the effect of the connection wiring 10 which is a feature of the present invention will be described.

With reference to FIG. 5, for example, a case is considered where there is a phase difference between a first differential signal outputted to the primary inductor 7 from the transistors 3 and 6 and a second differential signal outputted to the primary inductor 8 from the transistors 5 and 4. In this case, the plane 14 of mirror symmetry of FIG. 6 serves as a virtual AC ground. However, the plane 15 of mirror symmetry does not serve as a virtual AC ground. Therefore, being affected by the parasitic impedances ZP1 and ZP2 between the connection nodes SP1 and SP2 of the NMOS transistors of FIG. 7 and the ground node GND, the output power of the power amplifier 110 decreases. The larger the shift between the first and second differential signals is, the greater the influence of the parasitic impedances ZP1 and ZP2 becomes.

In this regard, by providing the connection wiring 10, the phase shift between the first and second differential signals can be suppressed, and the plane 15 of mirror symmetry is allowed to be closer to the virtual AC ground. As a result, the effects of the parasitic impedances ZP1 and ZP2 of the bonding wire become small, and the reduction in output of the power amplifier 110 can be suppressed.

Now, referring to the simulation results, the effect of the connection wiring 10 will be described more specifically. In this simulation, the output voltage waveforms of the transistors 3 to 6 are varied in an open-load state before coupling the transistors 3 to 6 of FIG. 5 to the terminals P1, N2, P2, and N1 of the primary inductor, respectively. Then, voltage waveforms of the terminals P1, N2, P2, and N1 of the primary inductors when coupling the transistors 3 to 6 to the terminals P1, N2, P2, and N1 of the primary inductors, respectively, are computed. To be specific, when the output voltage waveforms of the transistors 3 to 6 in the open-load state are as follows, $$\text{transistor 3: } V \cdot \cos(\omega t + \theta 3) \tag{1}$$

$$\text{transistor 4: } V \cdot \cos(\omega t + \pi + \theta 4) \tag{2}$$

$$\text{transistor 5: } V \cdot \cos(\omega t + \theta 5) \tag{3}$$

$$\text{transistor 6: } V \cdot \cos(\omega t + \pi + \theta 6) \tag{4}$$

phases $\theta 3$ to $\theta 6$ of the output signals of the transistors are given as: $\theta 3 = 0$, $\theta 4 = -10\pi/180$, $\theta 5 = -5\pi/180$, and $\theta 6 = +5\pi/180$. Further, in the expressions (1) to (4), angular frequency: $\omega$, time: t, and circular constant: $\pi$. In the simulation, a voltage amplitude V is set as $10^{1/2} = 3.16$ [V].

Figure 8A:
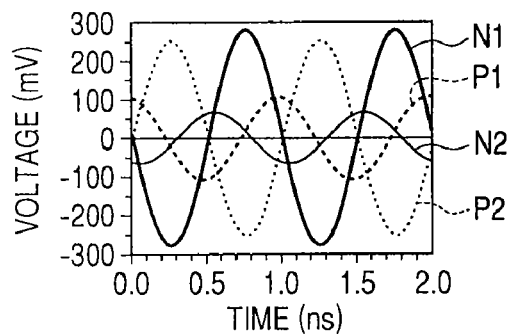
FIGS. 8(A) to 8(E) show a simulation result of signal waveforms of a comparative example of the power amplifier 110 of FIG. 5 not having a connection wiring 10.
Figure 8B:
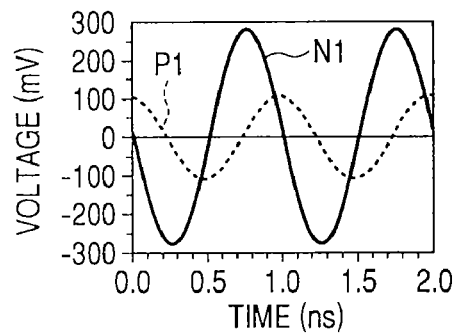
Figure 8C:
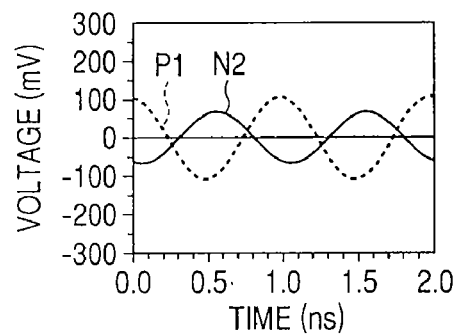
Figure 8D:
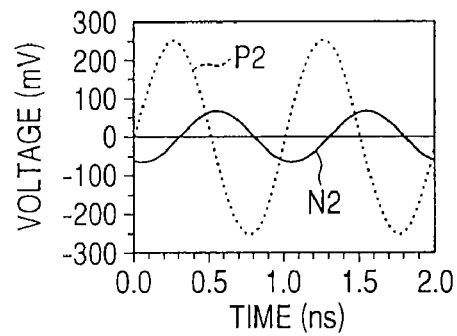
Figure 8E:
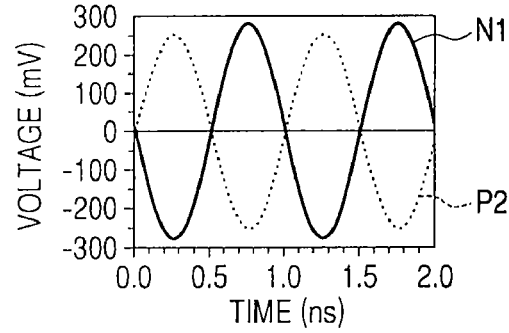
Figure 9A:
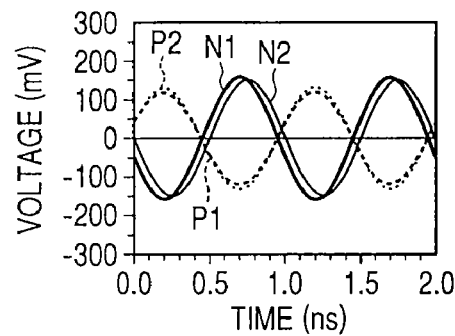
FIGS. 9(A) to 9(E) show a simulation result of signal waveforms in the power amplifier 110 of FIG. 5.
Figure 9B:
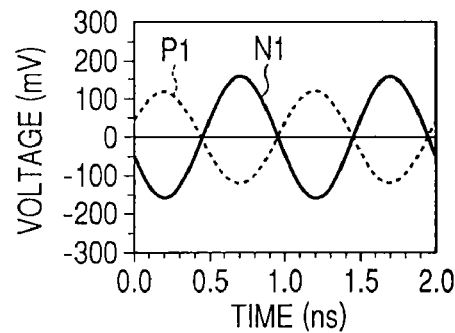
Figure 9C:
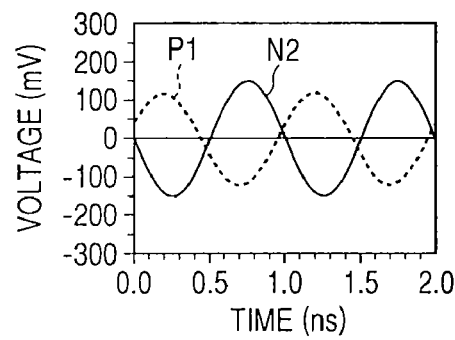
Figure 9D:
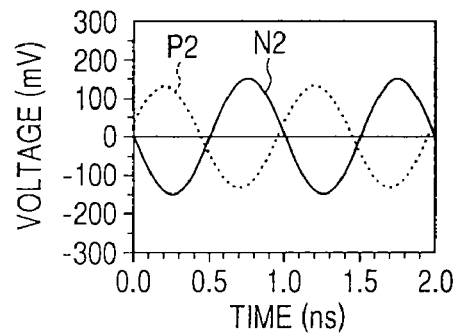
Figure 9E:
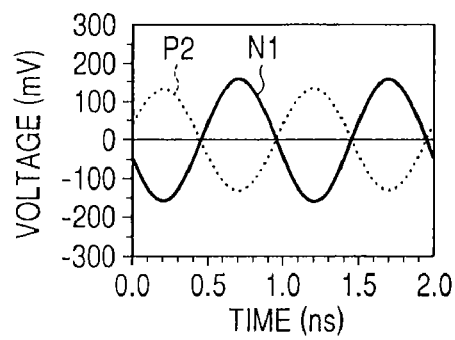

FIGS. 8(A) to 8(E) show simulation results of signal waveforms in the case of a power amplifier of a comparative example which does not have the connection wiring 10. FIG. 8(A) shows voltage waveforms of the terminals P1, N2, P2, and N1 of the primary inductor in an overlapped manner. Each of FIGS. 8(B) to 8(E) shows a pair of a non-inverted signal and an inverted signal which form a differential signal.

In the case of an ideal differential signal, a non-inverted signal and an inverted signal forming the differential signal are of the same amplitude and their phase difference is n. Of the four pairs forming the differential signals shown in FIGS. 8(B) to 8(E), in a case of a pair of a voltage waveform of the terminal P2 of the primary inductor 8 and a voltage waveform of the terminal N1 of the primary inductor 7 shown in FIG. 8(E), a phase difference between the two voltage waveforms is about π being close to the differential signal. On the other hand, other three pairs of the voltage waveforms (see FIGS. 8(B) to 8(D)) are greatly diverged from the differential signal.

In the present specification, when a phase difference between the non-inverted signal and the inverted signal forming the differential signal is π, a phase shift of the differential signal is regarded as 0, and when the phase difference shifts from π by φ, a phase shift of the differential signal is regarded as φ.

As shown in FIGS. 8(A) to 8(E), when a signal outputted from the differential pair diverges greatly from the differential signal, of the output signals of the differential pair, the same phase component is offset. Furthermore, as explained in FIG. 7, the output of the whole power amplifier 110 is reduced by receiving the influence of the parasitic impedance by the wiring (bonding wire) between the connection nodes SP1 and SP2 of the adjacent transistors and the ground node GND.

FIGS. 9(A) to 9(E) show simulation results of signal waveforms in the power amplifier 110 of FIG. 5. As in the case of FIGS. 8(A) to 8(E), FIG. 9(A) shows voltage waveforms of the terminals P1, N2, P2, and N1 of the primary inductors in a superposed manner, and each of FIGS. 9(B) to 9(E) shows a pair of a non-inverted signal and an inverted signal forming a differential signal. In the case of FIGS. 9(A) to 9(E), voltage waveforms of all the four pairs are close to the waveform of the differential signal. Thus, it is seen that, by providing the connection wiring 10, the phase shift of the differential signal is suppressed. Accordingly, a reduction in output of the power amplifier can be suppressed.

[Reason Why Phase Shift of Differential Signal is Suppressed]

The suppression effect for the phase shift of the differential signal seen in the simulation results of FIGS. 9(A) to 9(E) becomes prominent when the following condition (i) or (ii) is satisfied.

(i) The value of the phase shift of the differential signals between the transistors 3 and 6 (θ3-θ6 in the expressions (1) and (4) described above) is close to the value of the phase shift of the differential signals between the transistors 4 and 5 (θ4-θ5 in the expressions (2) and (3) described above)

(ii) The value of the phase shift of the differential signals between the transistors 3 and 4 (θ3-θ4 in the expressions (1) and (2) described above) is close to the value of the phase shift of the differential signals between the transistors 6 and 5 (θ6-θ5 in the expressions (3) and (4) described above)

When the condition (i) or (ii) is satisfied, a central point CP of the connection wiring 10 which couples the middle point MP1 of the primary inductor 7 to the middle point MP2 of the primary inductor 8 is in a state close to a virtual AC ground. An explanation thereof will be given specifically with use of expressions. When the output signals of the transistors 3 to 6 are given by the expressions (1) to (4), using k as a wave number vector, the voltage amplitude at the central point CP located at the same distance x from each of the transistors 3 to 6 is expressed as follows:

$$V \cdot \{\cos(kx+\omega t+\theta 3)+\cos(kx+\omega t+\pi+\theta 4)+\cos(kx+\omega t+\theta 5)+\cos(kx+\omega t+\pi+\theta 6)\} \quad (5)$$

The amplitude component of the expression (5) becomes the smallest when the above condition (1) or (ii) is satisfied.

Figure 10:
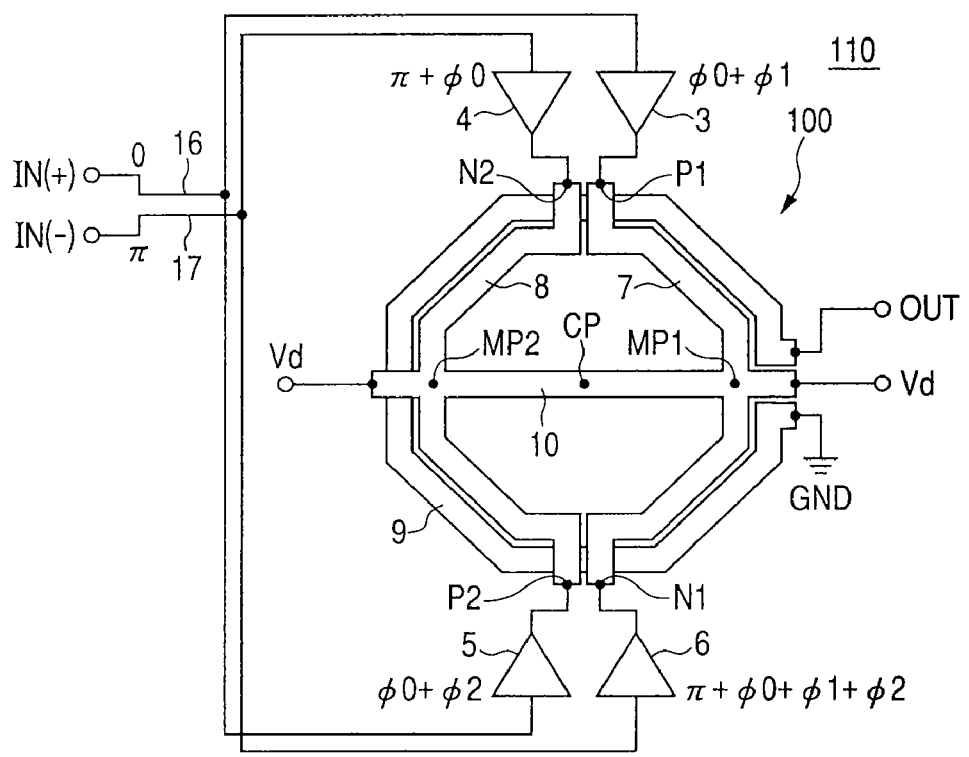
FIG. 10 illustrates the phase shift in output signals of transistors 3 to 6 of FIG. 5.

FIG. 10 illustrates a phase shift in the outputs of the transistors 3 to 6 of FIG. 5. Referring to FIG. 10, it is conceivable that the conditions (i) and (ii) described above are actually produced due to the following causes.

First, a case is possible where variations arise among characteristics of the transistors 3 to 6 due to a cause related to a manufacturing process. To be specific, it is the case where characteristics of the adjacent transistors are the same and characteristics of the transistors which are away from each other are different. In this case, as shown in FIG. 10, corresponding to the difference in parasitic capacitance of the transistors, the outputs of the transistors 5 and 6 come to have a phase difference φ2 with respect to the outputs of the transistors 3 and 4.

Furthermore, as shown in FIG. 10, it is conceivable that a length of a differential-input wiring 16 from an input terminal 1 to the transistors 3 differs from that of the transistor 5. Further, it is conceivable that a length of a differential-input wiring 17 from an input terminal 2 to the transistors 4 is different from that of the transistor 6. In such cases also, the outputs of the transistors 5 and 6 have a phase difference φ2 with respect to the outputs of the transistors 3 and 4.

Further, as shown in FIG. 10 or 5, it is conceivable that a length of the differential input wiring 16 from the input terminal 1 to the transistor 3 is different from a length of the differential input wiring 17 from the input terminal 2 to the transistor 4. Also, it is conceivable that a length of the differential input wiring 17 from the input terminal 2 to the transistor 6 is different from a length of the differential input wiring 16 from the input terminal 1 to the transistor 5. In such cases, outputs of the transistors 3 and 6 come to have a phase difference φ1 with respect to each of the outputs of the transistors 4 and 5.

Further, it is conceivable that a bias voltage applied to the middle point MP1 of the primary inductor 7 differs from a bias voltage applied to the middle point MP2 of the primary inductor 8. When a difference arises in parasitic capacitance of transistors as a result of the above, the outputs of the transistors 3 and 6 come to have a phase difference φ1 with respect to the outputs of the transistors 4 and 5.

When all of the above factors take place, as shown in FIG. 10, the phases θ3 to θ6 of the output signals of the transistors 3 to 6 given by the expressions (1) to (4) described above are shown such as: θ3=φ0+φ1, θ4=φ0, θ5=φ2, and θ6=φ0+φ1+φ2. As described above, the phase lag caused by a common factor of the transistors 3 to 6 is shown by φ0. In this case, θ3-θ6=θ4-θ5=φ1. Therefore, it is seen that the condition (i) is satisfied. Further, θ3-θ4=θ6-θ5=φ2. Therefore, it is seen that the above condition (ii) is satisfied. Thus, even if the phase shift in the outputs of the transistors 3 to 6 is caused by the above factors, its influence can be suppressed by the connection wiring 10.

FIGS. 11(A) to 11(D) illustrate the suppression effect for the phase shift of the differential signal. From another aspect, it is conceivable that the above suppression effect is related to forming the four differential pairs in total coupled by the wirings on the substrate.

Figure 11A:
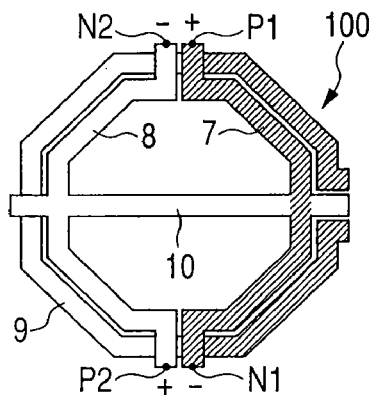
FIGS. 11(A) to 11(D) illustrate a suppression effect for the phase shift in differential signals.
Figure 11B:
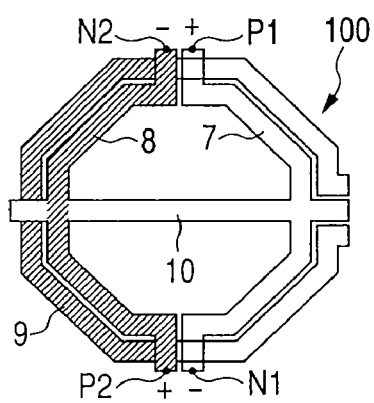
Figure 11C:
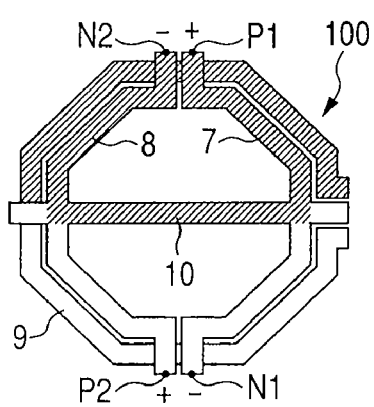
Figure 11D:
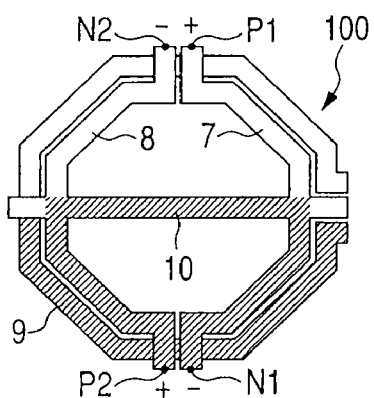

To be specific, as shown in FIG. 11(A), the transistor 3 of FIG. 10 coupled to the terminal P1 is coupled with the transistor 6 of FIG. 10 coupled to the terminal N1 by the primary inductor 7. As shown in FIG. 11(B), the transistors 5 and 4 coupled respectively to the terminals P2 and N2 are coupled by the primary inductor 8. As shown in FIG. 11(C), the transistors 3 and 4 of FIG. 10 coupled, respectively, to the terminals P1 and N2 are coupled by the connection wiring 10. As shown in FIG. 11(D), the transistors 5 and 6 of FIG. 10 coupled to the terminals P2 and N1, respectively, are coupled with each other by the connection wiring 10.

Not only in the case where there is a phase shift in outputs of the transistors 3 to 6 but also in a case where there occurs a phase shift in amplitude, the influence of the shift in amplitude can be reduced by providing the connection wiring 10. In the case of the shift in amplitude also, the effect of the connection wiring 10 becomes prominent when conditions similar to the above conditions (i) and (ii) are satisfied with respect to the relationship of the size of amplitudes. To be specific, when amplitudes of the output voltages of the transistors 3 to 6 are V3, V4, V5, and V6, respectively, the effect of reducing the influence of the amplitude shift becomes prominent in the cases below:

(iii) The value of the difference V3-V6 of the voltage amplitude between the transistors 3 and 6 is close to the value of the difference V4-V5 of the voltage amplitude between transistors 4 and 5, or (iv) The value of the difference V3-V4 of the voltage amplitude between the transistors 3 and 4 is close to the value of the difference V6-V5 of the voltage amplitude between the transistors 6 and 5.

[Conclusion]

As described above, even if there exists a phase shift or an amplitude shift in differential signals outputted from the transistors 3 to 6, by providing the connection wiring 10 which couples the middle points of the primary inductors 7 and 8, the shift in the differential operation of the power amplifier 110 as a whole can be suppressed. As a result, reduction in output of the power amplifier 110 can be suppressed.

Moreover, since the shift in the differential signals is suppressed like this, the maximum voltage amplitude at the output portions (drain in a CMOS) of the transistors 3 and 6 can also be suppressed, which can prevent the destruction of the transistors. In particular, the above is effective for a CMOS whose breakdown voltage between the source and the drain is low.

Further, in an ideal state, the power amplifier (transformer-based amplifier) described in FIGS. 1 to 4 can offset even high frequencies outputted from the transistor with use of the transformer. Therefore, eventually, less-distorted output can be obtained. However, when there is a shift in the differential operation of the whole power amplifier, the even high frequencies are transmitted to the secondary inductor 9. Accordingly, the final output becomes greatly distorted. Therefore, if the shift in the differential signals is suppressed by coupling the middle points of the primary inductors 7 and 8, the distortion of the final output power can be reduced. That is, by electrically coupling the middle points of the primary inductors, a reduction in output of the whole amplifier 110 and an increase in distortion caused by a shift of the differential input signal or variations among the transistors can be suppressed.

Moreover, as shown in FIG. 7, when the differential operation is ideal in the whole power amplifier 110 of FIG. 5, the plane 14 of mirror symmetry of the primary inductors 7 and 8 serves as a virtual AC ground. Therefore, the connection wiring 10 hardly influences the high frequency characteristic of the transformer 100 (specific simulation results are shown in Embodiment 2). Even when the output signals of the transistors 3 to 6 are varied, since the shift in the differential operation of the whole power amplifier 110 is suppressed by the wiring 10, the influence which the connection wiring 10 has on the high frequency characteristic of the transformer 100 becomes small.

Figure 12:
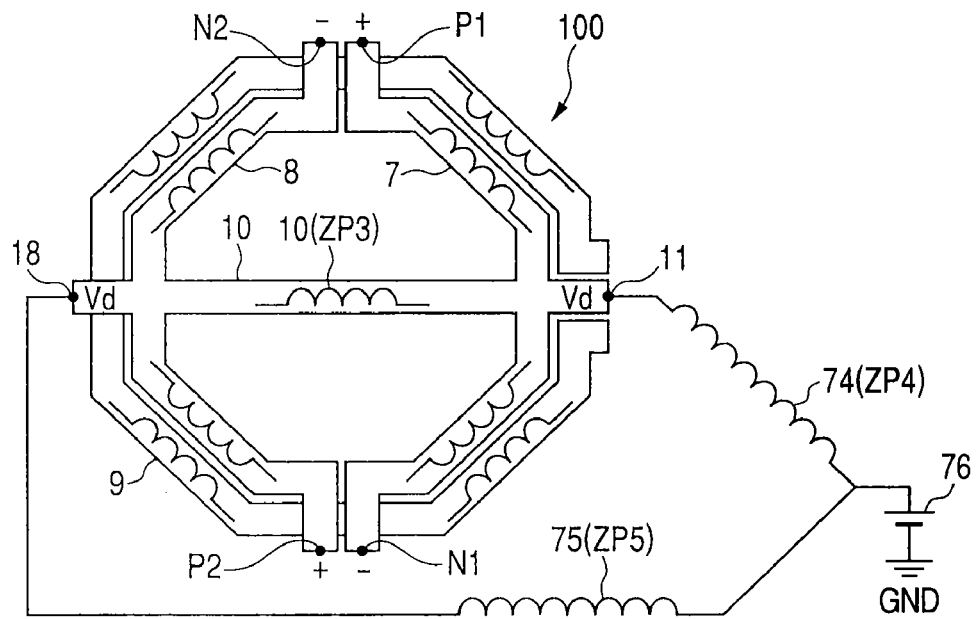
FIG. 12 is a circuit diagram including an external power supply circuit to be coupled to Vd terminals 11 and 18 of the transformer 100 of FIG. 5.

FIG. 12 is a circuit diagram including an external power supply circuit coupled to Vd terminals 11 and 18 of the transformer 100 of FIG. 5. With reference to FIG. 12, an influence of the connection wiring 10 on the high frequency characteristic will be additionally explained.

As shown in FIG. 12, the Vd terminals 11 and 18 of the transformer 100 are coupled to a DC power supply 76 through wirings 74 and 75 including bonding wires. The wirings 74 and 75 have parasitic impedances ZP4 and ZP5, respectively. In this regard, a parasitic impedance ZP3 of the connection wiring 10 which couples the middle points of the primary inductors 7 and 8 is small enough as compared to the parasitic impedances ZP4 and ZP5 of the external wirings 74 and 75 of the transformer 100. Therefore, the parasitic impedance ZP3 of the connection wiring 10 can be disregarded.

If the magnitude of the parasitic impedance ZP3 of the connection wiring 10 coupling the middle points of the primary inductors 7 and 8 is not negligible, the function to suppress the shift in the differential operation of the power amplifier 110 as a whole is weakened. Therefore, even if the middle points of the primary inductors 7 and 8 are coupled by the wiring which bypasses the outside of the transformer, an effect equivalent to the case of coupling the inner sides of the primary inductors 7 and 8 cannot be expected.

Modification 1 of Embodiment 1

Figure 13:
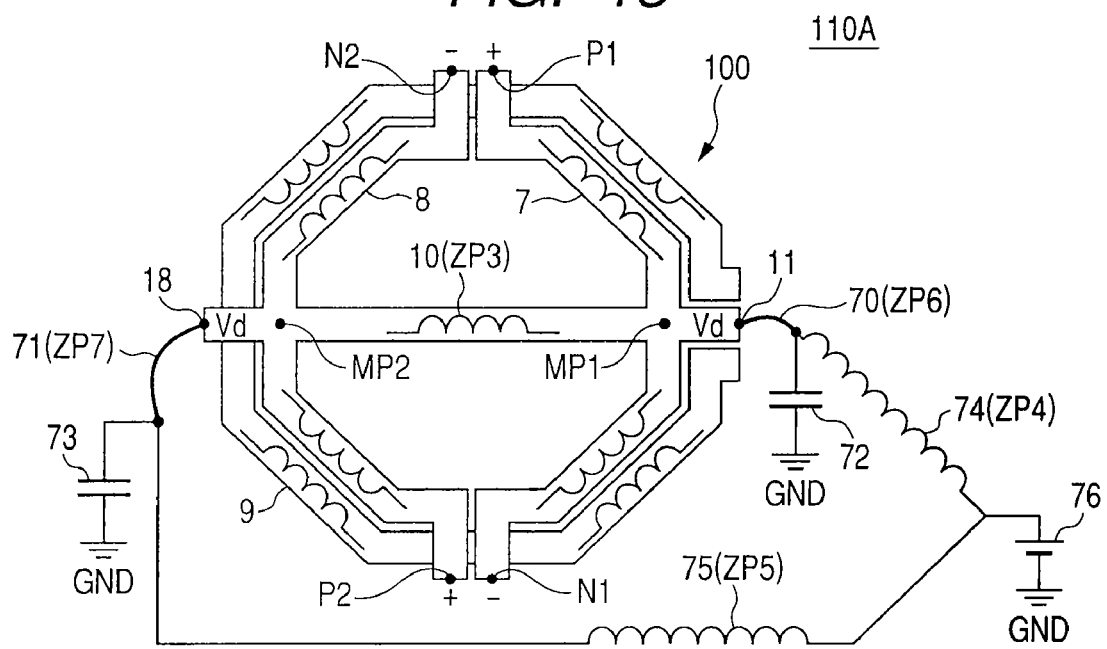
FIG. 13 shows a configuration of a power amplifier 110A of Modification 1 of Embodiment 1.

FIG. 13 shows a configuration of a power amplifier 110A according to Modification 1 of Embodiment 1. The power amplifier 110A of FIG. 13 is different from the power amplifier 110 of FIGS. 5 and 12 in that it further includes bypass capacitors 72 and 73 coupled between the middle points MP1 and MP2 of the primary inductors 7 and 8 and the ground node GND. To be specific, the bypass capacitor 72 is coupled to the Vd terminal 11 on the side of the middle point MP1 through a bonding wire 70. Also, the bypass capacitor 73 is coupled to the Vd terminal 18 on the side of the middle point MP2 through a bonding wire 71. Except for those points, the power amplifier 110A of FIG. 13 is identical to the power amplifier 110 shown in FIGS. 5 and 12. Therefore, the same reference characters are used to identify the same or corresponding parts and the repetitive explanations thereof are omitted. Also, in FIG. 13, the transistors 3 to 6 are not shown.

Suppose that there is not provided the connection wiring 10 for coupling the middle points MP1 and MP2 of the primary inductors 7 and 8. Further, suppose that the bypass capacitors 72 and 73 are directly coupled to the middle point MP1 and MP2 of both the primary inductors 7 and 8 to achieve an AC ground. In this case, since a common mode (same-phase component) cannot exist, there will hardly be a shift in differential signals. To be specific, a little common mode remains because of the capacitive coupling between the primary and secondary inductors 7 and 8 and the secondary inductor 9. However, they are small enough to be neglected.

In reality, however, the bypass capacitors 72 and 73 are of large capacity and they cannot be formed together with the transformer 100 on the same chip. Therefore, even in the nearest case, the bypass capacitors 72 and 73 are arranged behind the bonding wires 70 and 71 as chip components. As a result, there take place parasitic impedances ZP4 and ZP5 of the bonding wires 70 and 71 up to the AC ground GND. If the parasitic impedance is large, the suppression effect for the shift in the differential signals due to the AC ground of the middle points MP1 and MP2 of the primary inductors 7 and 8 is weakened.

According to the power amplifier 110A of FIG. 13, by providing the connection wiring 10 coupling the middle points MP1 and MP2 of the primary inductors 7 and 8, the parasitic impedances from the middle points MP1 and MP2 of the primary inductors 7 and 8 to the AC ground GND can be made small. This is because the number of paths from the middle points MP1 and MP2 of the primary inductors 7 and 8 to the AC ground GND increases and the parasitic impedances are combined. For example, in the case of FIG. 13, the parasitic impedance caused by the bonding wire 70 and the parasitic impedance from the connection wiring 10 to the bonding wire 71 are combined in parallel to form the parasitic impedance from the Vd terminal 11 to the AC ground GND. Similarly, the parasitic impedance caused by the bonding wire 71 and the parasitic impedance from the connection wiring 10 to the bonding wire 70 are combined in parallel to form the parasitic impedance from the Vd terminal 18 to the AC ground GND. Such an effect of the parasitic impedance to the AC ground to be reduced becomes more prominent remarkable as the number n of stages of the transformers to be coupled increases. This is because the paths to the AC ground become the ones in parallel through respective n number of bypass capacitors.

Modification 2 of Embodiment 1

Figure 14:
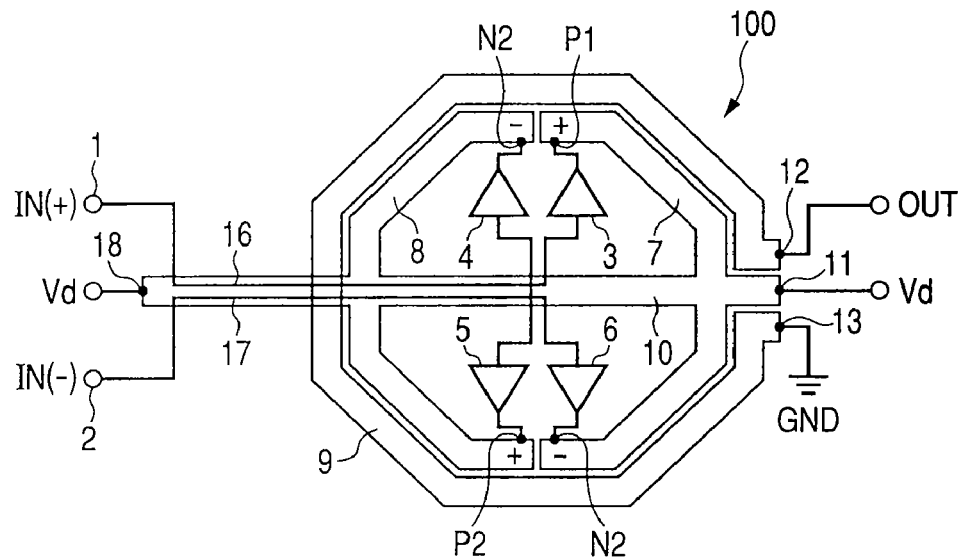
FIG. 14 shows a configuration of a power amplifier 110B of Modification 2 of Embodiment 1.

FIG. 14 shows a configuration of a power amplifier 110B according to Modification 2 of Embodiment 1. The arrangement of the transistors 3 to 6 in the power amplifier 110B of FIG. 14 differs from that of the power amplifier 110 of FIG. 5.

In the power amplifier 110 of FIG. 5, the transistors 3 to 6 are arranged outside the transformer 100. However, in the power amplifier 110B of FIG. 14, the transistors 3 to 6 are arranged inside the transformer 100. In either arrangement, it is preferable that all the transistors 3 to 6 are arranged mirror symmetrically with respect to the same symmetrical planes (reference numerals 14 and 15 in FIG. 6) as the whole primary inductors 7 and 8.

Furthermore, differential input wirings 16 and 17 which couples the input terminals 1 and 2 with the transistors 3 to 6 may be arranged near the plane of mirror symmetry (reference numeral 14 in FIG. 6) of the whole primary inductors. In this regard, a central line between the differential input wirings 16 and 17 adjacent to each other and a plane of mirror symmetry of the whole primary inductor (either of them is virtually AC grounded) are arranged so as to match with each other. Even when the transistors are arranged outside the transformer, it is preferable that the differential input wirings 16 and 17 are arranged similarly.

In the case of the power amplifiers of Embodiments 2 and 3 to be described later also, it is preferable that the transistors and the differential input wirings are similarly arranged as above.

Embodiment 2

In Embodiment 2, there is described a configuration of a power amplifier corresponding to the transformer-based amplifier having a turn ratio of 1:m (where m is an integer of two or greater) shown in FIG. 4.

Figure 15:
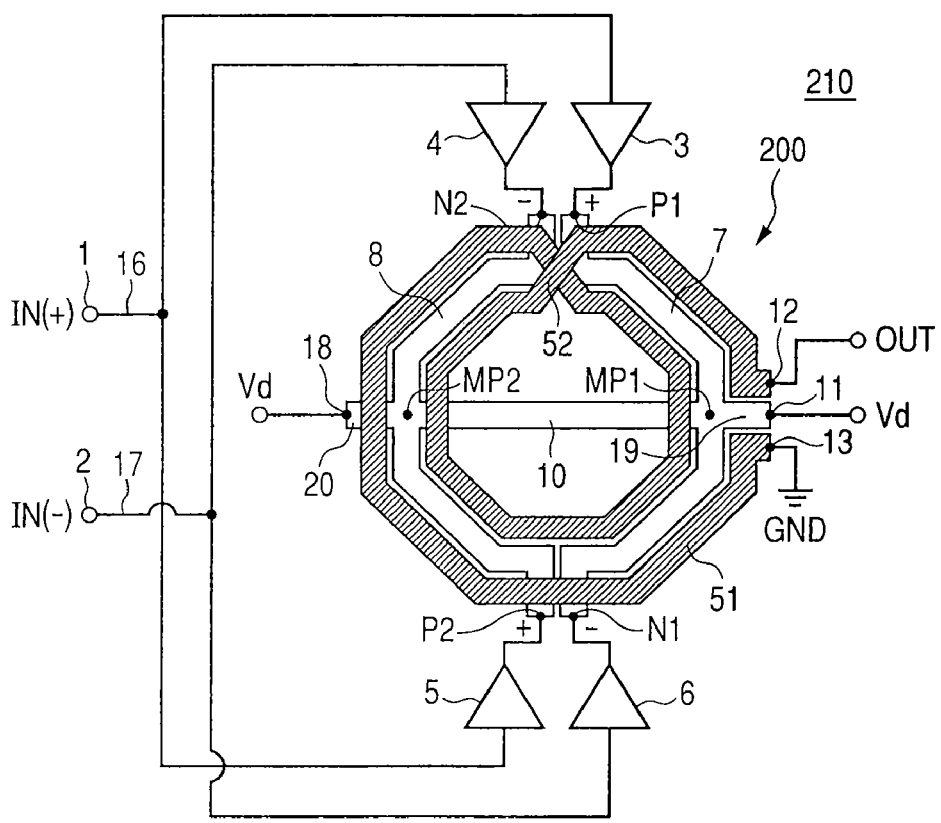
FIG. 15 shows a configuration of a power amplifier 210 of Embodiment 2 of the present invention.

FIG. 15 shows a configuration of a power amplifier 210 according to Embodiment 2 of the present invention. The power amplifier 210 of FIG. 15 corresponds to the transformed-based amplifier whose number of stages n is 2 and turn ratio is 1:2 in FIG. 4. That is, a transformer 200 of FIG. 15 is different from the transformer 100 of FIG. 5 having the secondary inductor 9 of single turn in that its secondary inductor 51 is a two turn inductor. Also, in FIG. 15, hatching is used for the secondary inductor 51 to make the drawing easier to see.

In the case of FIG. 15, the secondary inductor 51 is of two turn. Therefore, a feature of mirror symmetry of the transformer 200 as a whole is lost. However, by arranging a crossing part 52 on a plane of mirror symmetry (reference numeral 15 in FIG. 6) of the whole primary inductors 7 and 8, the shift in the differential operation of the power amplifier 210 as a whole when the differential signal is inputted can be minimized. As a result, the reduction in the final output of the power amplifier 210 can be suppressed.

Figures 16, 17:
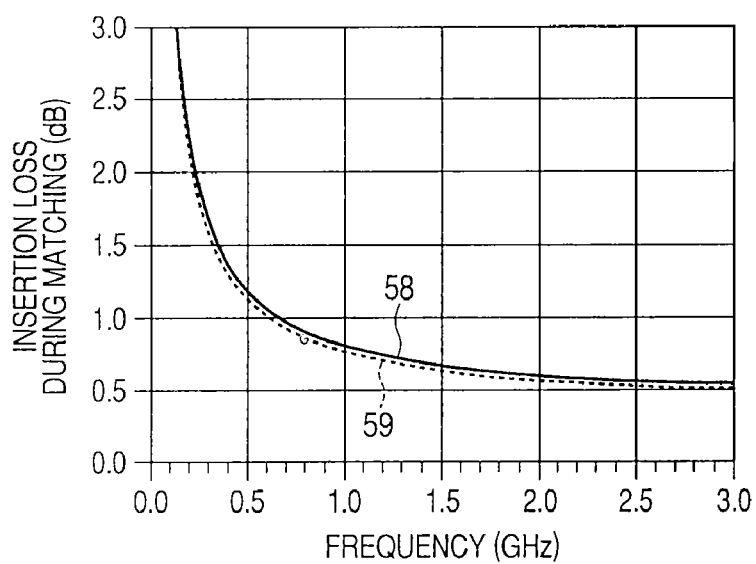
FIG. 16 is a table showing a result in which a high-frequency characteristic of a transformer 200 of FIG. 15 is worked out by electromagnetic field simulation.
FIG. 17 shows a result in which an insertion loss during matching of the transformer 200 of FIG. 15 is worked out by an electromagnetic field simulation.

FIG. 16 is a table showing results in which high-frequency characteristics of the transformer 200 of FIG. 15 are worked out by an electromagnetic-field simulation.

In the simulation, with respect to an outer circumference of the secondary inductor of the transformer 200, a length in the horizontal direction in the drawing (in an extending direction of the connection wiring 10) is set to 900 μm. Further, a length in the vertical direction in the drawing is set to 760 μm. A Cu (copper) wiring is used for the wiring of the transformer 200. Further, a wiring width of the primary inductors 7 and 8 is 60 μm, a wiring width of the secondary inductor 51 is 30 μm, and a wiring width of the wiring parts 19 and 20 for Vd application and the connection wiring 10 is set to 50 μm.

The table of the simulation results of FIG. 16 shows a comparison between a case where the connection wiring 10 is provided and a case where it is not provided. In FIG. 16, a turn ratio per transformer corresponds to the turn ratio m of FIG. 4. It is seen that the turn ratio hardly changes according to the connection wiring 10 which is laid across the inside of the transformer 200.

FIG. 17 shows a result in which an insertion loss during matching of the transformer 200 of FIG. 15 is worked out by the electromagnetic-field simulation. The insertion loss during matching means a minimum insertion loss that can be achieved by the transformer 200 at each frequency. The graph 58 of a solid line shows a simulation result when the connection wiring 10 is provided as in FIG. 15. The graph 59 of a dashed line shows a simulation result when the connection wiring 10 is not provided.

According to the simulation results of FIG. 17, it is seen that, at each frequency, there is little difference in the insertion loss during matching between the case where the connection wiring is provided and the case where the connection wiring is not provided. For example, there is an increase in loss of 0.03 dB when the connection wiring 10 is provided at the frequency of 900 MHz. However, the increase in loss is 1% or smaller in terms of percentage.

To be exact, the virtual AC ground is realized only on the plane of mirror symmetry. Therefore, the virtual AC ground is not ideally achieved in the whole connection wiring 10 having a limited width provided on the plane of mirror symmetry. Thus, even if the connection wiring 10 passes through the plane of mirror symmetry, when an area occupied is not negligible with respect to the transformer, it causes an increase in insertion loss. Therefore, it is not preferable to use an extremely wide wiring for the coupling of the middle points MP1 and MP2 of the primary inductors 7 and 8. On the other hand, when using an extremely narrow wiring, due to parasitic resistance and parasitic inductance of the connection wiring 10 itself, a function to suppress the shift in differential operation of the power amplifier 210 as a whole is weakened. That is, there is a relationship of tradeoff between the insertion loss of the transformer 200 and an adjusting function of the differential operation.

Modification 1 of Embodiment 2

Figure 18:
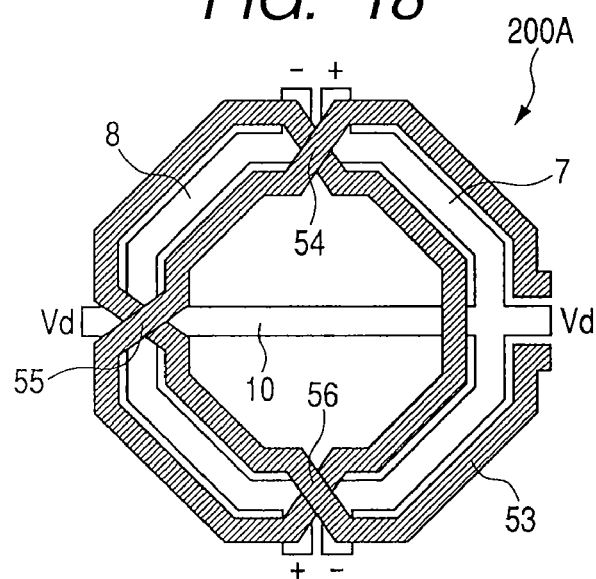
FIG. 18 is a plan view showing a configuration of a transformer 200A according to Modification 1 of Embodiment 2.

FIG. 18 is a plan view showing a configuration of a transformer 200A according to Modification 1 of Embodiment 2. A secondary inductor 53 of FIG. 18 is different from the secondary inductor 51 of FIG. 15 having a single crossing part 52 in that it has three crossing parts 54, 55, and 56. Except for that point, the transformer 200A of FIG. 18 is identical to the transformer 200 of FIG. 15. Therefore, the same reference characters are used to identify the same or corresponding parts and repetitive explanations thereof are omitted. Further, in FIG. 18, hatching is used for the secondary inductor 53 to make the drawing easier to see.

When the secondary inductor 53 is a two turn inductor, in order to maintain mirror symmetry of the whole transformer, odd numbers of crossing parts are required. As shown in FIG. 18, when three crossing parts 54, 55, and 56 are formed in the secondary inductor 53, it is desirable to arrange these crossing parts 54, 55, and 56 on the plane of mirror symmetry (referential numerals 14 and 15 in FIG. 6) of the whole primary inductors 7 and 8 so that mirror symmetry of the whole transformer 200A may be maintained. To be specific, mirror symmetry cannot be kept with respect to the order of the crossing parts 54, 55, and 56 to be overlapped. However, the above can be neglected because it hardly affects the characteristic of the power amplifier.

Modification 2 of Embodiment 2

Figure 19:
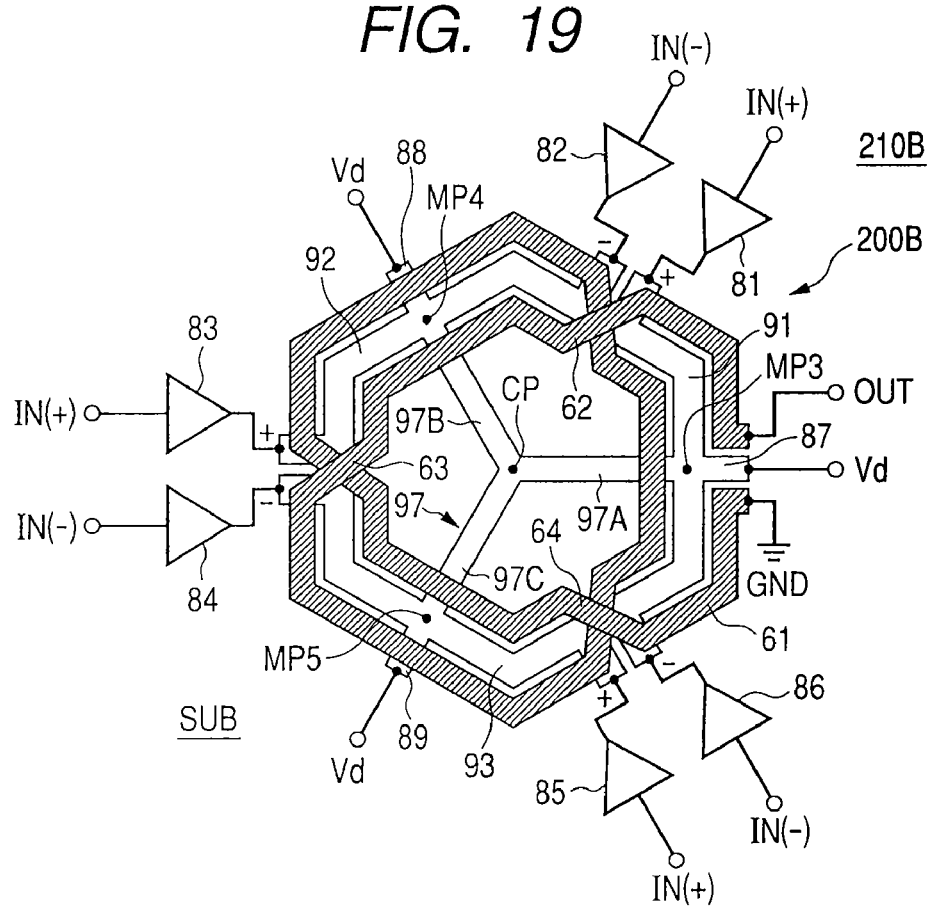
FIG. 19 shows a configuration of a power amplifier 210B according to Modification 2 of Embodiment 2.

FIG. 19 shows a configuration of a power amplifier 210B according to Modification 2 of Embodiment 2. The power amplifier 210B of FIG. 19 corresponds to the transformer-based amplifier of FIG. 4 whose number of stages n is 3 and turn ratio is 1:2. The power amplifier 210B comprises amplifiers 81 to 86 and a transformer 200B formed on a substrate SUB.

The amplifiers 81, 83, and 85 amplify non-inverted signals IN(+) among the differential input signals, and the amplifiers 82, 84, and 86 amplify inverted signals IN(−) among the differential input signals. The amplifiers 81 to 86 are of the same configuration. In general, each of them comprises a MOS transistor of the source ground. Hereafter, the amplifiers 81 to 86 are also referred to as the "transistors to 86," respectively. The differential input signals amplified by the transistors 81 to 86 are inputted to the transformer 200B.

The transformer 200B comprises: three primary inductors 91 to 93 arranged in a circular geometry; a two turn secondary inductor 61; a connection wiring 97; and wiring parts 87 to 89 for applying a drain voltage (Vd).

Figure 20:
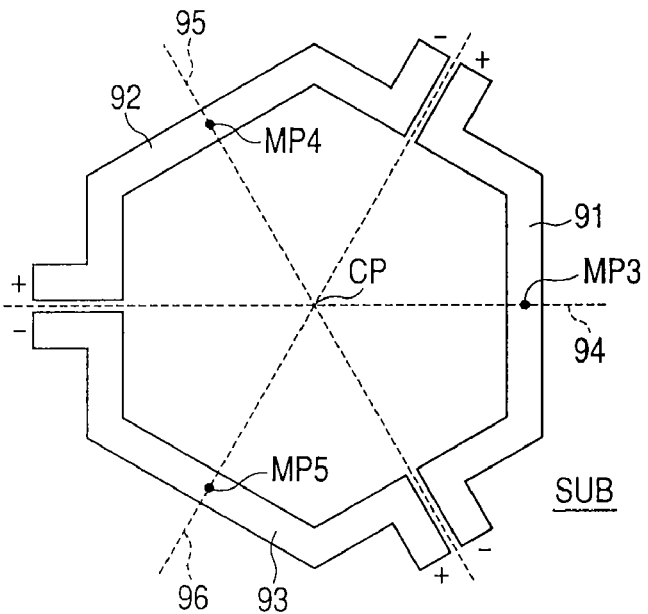
FIG. 20 is a plan view showing a layout of primary inductors 91 to 93 of the power amplifier 210B of FIG. 19.

FIG. 20 is a plan view showing a layout of the primary inductors 91 to 93 of the power amplifier 210B of FIG. 19. Each of the primary inductors 91 to 93 has a profile of ⅓ turn (⅓ of one turn). The primary inductors 91 to 93 as a whole are arranged in a circular geometry. In the case of FIG. 20, a profile of the primary inductors 91 to 93 as a whole is of three-time rotational symmetry about a central axis passing through the central point CP on a substrate and being perpendicular to the substrate. Furthermore, the profile of the primary inductors 91 to 93 as a whole is mirror symmetrical relative to each of the symmetrical planes 94, 95, and 96 containing the central axis of the rotational symmetry. Each of the symmetrical planes 94 to 96 passes through a middle point of each of the primary inductors 91 to 93, respectively.

Referring to FIG. 19 again, the transistors 81 and 86 are coupled, respectively, to two ends of the primary inductor 91, the transistors 83 and 82 are coupled, respectively, to two ends of the primary inductor 92, and the transistors 85 and 84 are coupled, respectively, to two ends of the primary inductor 93. The transistors 81 and 82 of FIG. 19 are provided close to each other at a position symmetrical to the symmetrical plane 96 of FIG. 20. Similarly, the transistors 83 and 84 are provided close to each other at a position symmetrical to the symmetry plane 94, and the transistors 85 and 86 are provided close to each other at a position symmetrical to the symmetry plane 95. The whole of the transistors 81 to 86 is mirror symmetrical to each of the planes 94 to 96 of mirror symmetry of FIG. 20.

A two turn secondary inductor 61 is arranged adjacent to the primary inductors 91 to 93. By being magnetically coupled to the primary inductors 91 to 93, the secondary inductor 61 further combines the signals made by combining the signals IN(+) and IN(−) in each primary inductor. The secondary inductor 61 includes three crossing parts 62 to 64. The crossing parts 62 to 64 are provided close to one of the planes of mirror symmetry relative to the primary inductors 91 to 93 as a whole, thereby allowing the secondary inductor 61 to have a configuration similar to a three-time rotational symmetry. To be specific, the crossing part 62 is arranged close to the symmetrical plane 96 of FIG. 20, the crossing part 63 is arranged close to the symmetrical plane 94 of FIG. 20, and the crossing part 64 is arranged close to the symmetrical plane 95 of FIG. 20.

The connection wiring 97 is provided inside the primary inductors 91 to 93 arranged in a circular geometry, and couples the middle points MP3, MP4, and MP5 of respective primary inductors. To be specific, the connection wiring 10 comprises: a wiring part 97A which couples the central point CP to the middle point MP3 of the primary inductor 91; a wiring part 97B which couples the central point CP to the middle point MP4 of the primary inductor 92; and a wiring part 97C which couples the central point CP to the middle point MP5 of the primary inductor 93. Each of the wiring parts 97A to 97C is provided along a plane of mirror symmetry passing through the middle point of the corresponding primary inductor. When the number of the primary inductors (namely, the number of stages n of the transformer-based amplifiers) increases, the number of wires of the wiring part which couples the central point CP to the middle point of each of the primary inductors increases. As a result, the area of the connection wiring increases, which tends to increase the insertion loss of the transformer.

The wiring parts 87 to 89 for Vd application are drawn out from the middle points of the primary inductors 91 to 93, respectively. A drain bias voltage is supplied to each transistor through the primary inductor to which each transistor is coupled. A DC current hardly flows through the connection wiring 97 arranged along the plane of mirror symmetry.

Embodiment 3

In Embodiment 3, a case where a drain voltage of a transistor for amplifying a differential signal is supplied from one spot on the primary side of the transformer is explained.

Figure 21:
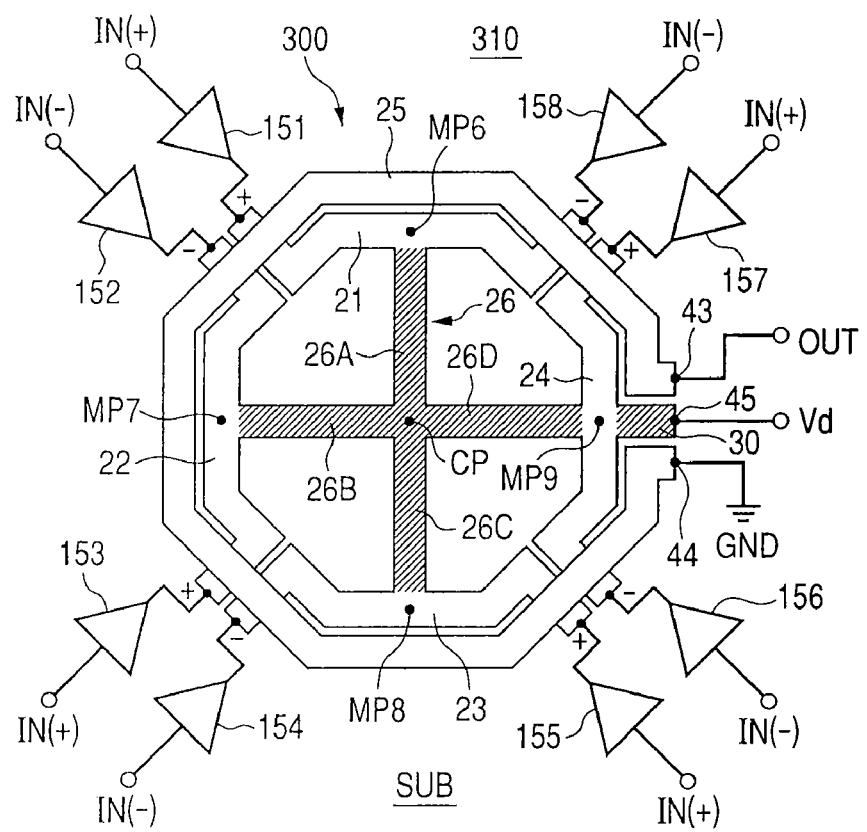
FIG. 21 shows a configuration of a power amplifier 310 according to Embodiment 3 of the present invention.

FIG. 21 shows a configuration of a power amplifier 310 according to Embodiment 3 of the present invention. The power amplifier 310 of FIG. 21 corresponds to the transformer-based amplifier of FIG. 2 whose number of stages n is 4 and turn ratio is 1:1. The power amplifier 310 comprises amplifiers 151 to 158 and a transformer 300 which are formed on the substrate SUB.

The amplifiers 151, 153, 155, and 157 amplify non-inverted signals IN(+) among the differential input signals, and the amplifiers 152, 154, 156, and 158 amplify inverted signals IN(−) among the differential input signals. The amplifiers 151 to 158 are of the same configuration and, in general, comprise MOS transistors of the source ground. Hereafter, the amplifiers 151 to 158 are also referred to as the "transistors 151 to 158," respectively. The differential input signals amplified in the transistors 151 to 158 are inputted to the transformer 300.

The transformer 300 comprises: four primary inductors 21 to 24 arranged in a circular geometry; a secondary inductor 25 of one turn; a connection wiring 26; and a wiring part 30 for applying a drain voltage (Vd). In FIG. 21, hatching is used for the connection wiring 26 and the wiring part 30 to make the drawing easier to see.

Figure 22:
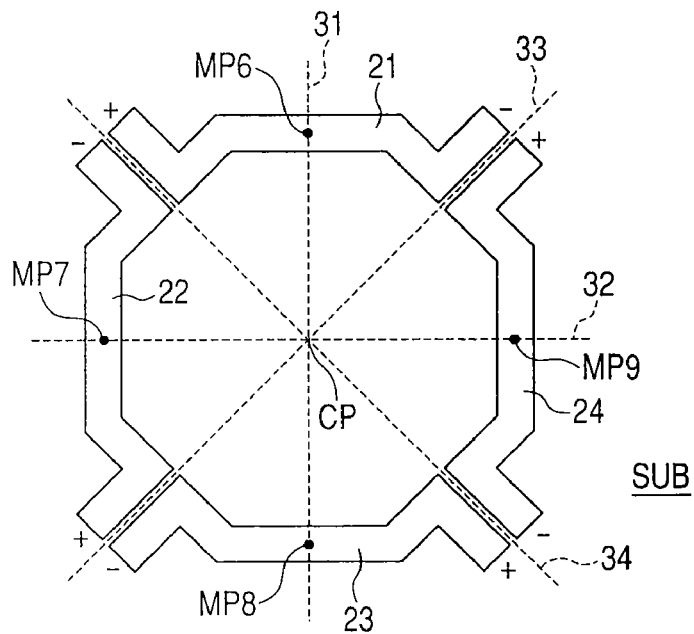
FIG. 22 is a plan view showing a layout of primary inductors 21 to 24 of a power amplifier 310 of FIG. 21.

FIG. 22 is a plan view showing a layout of the primary inductors 21 to 24 of the power amplifier 310 of FIG. 21.

Each of the primary inductors 21 to 24 has a profile of ¼ turn (¼ of one turn). The primary inductors 21 to 24 as a whole are arranged in a circular geometry. In the case of FIG. 22, the primary inductors 21 to 24 as a whole are of four-time rotational symmetry about a central axis passing through the central point CP on a substrate and being perpendicular to the substrate. Furthermore, the primary inductors 21 to 24 as a whole are mirror symmetrical relative to each of the symmetrical planes 31 to 34 containing the central axis of rotational symmetry. The symmetrical plane 31 passes through the middle point MP6 of the primary inductor 21 and the middle point MP8 of the primary inductor 23. The symmetrical plane 32 passes through the middle point MP7 of the primary inductor 22 and the middle point MP9 of the primary inductor 24.

Referring again to FIG. 21, the transistors 151 and 158 are coupled to two ends of the primary inductor 21, respectively. The transistors 153 and 152 are coupled to two ends of the primary inductor 22, respectively. Further, the transistors 155 and 154 are coupled to two ends of the primary inductor 23, respectively. Still further, the transistors 157 and 156 are coupled to two ends of the primary inductor 24, respectively. The transistors 151 to 158 as a whole are mirror symmetrical relative to each of the planes 31 to 34 of mirror symmetry of FIG. 22.

A secondary inductor 25 of one turn is arranged adjacent to the primary inductors 21 to 24. Further, by being magnetically coupled to the primary inductors 21 and 24, the secondary inductor 25 combines differential input signals inputted to respective primary inductor. By grounding one terminal 44 of the secondary inductor 25, the combined signal is outputted from the other terminal 43 as a single-phase output signal OUT.

The connection wiring 26 is laid inside the primary inductors 21 to 24 arranged in a circular geometry and couples middle points MP6 to MP9 of the respective primary inductors. To be specific, the connection wiring 26 comprises: a wiring part 26A coupling a central point CP to a middle point MP6 of the primary inductor 21; a wiring part 26B for coupling the central point CP to a middle point MP7 of the primary inductor 22; a wiring part 26C for coupling the central point CP to a middle point MP8 of the primary inductor 23; and a wiring part 26D for coupling the central point CP to a middle point 9 of the primary inductor 24. Each of the wiring parts 26A to 26D is provided along the plane of mirror symmetry passing through the middle point of the corresponding primary inductor.

The wiring part 30 for applying Vd is drawn out from the middle point MP9 of the primary inductor 24 to the outside of the transformer 300. A drain bias voltage is applied to a Vd terminal 45 of the wiring part 30. A drain bias voltage is supplied to the transistors 157 and 156 coupled to two ends of the primary inductor 24 through the wiring part 30 and the primary inductor 24. A drain bias voltage is supplied to the transistors 151 and 158 coupled to two ends of the primary inductor 21 through the wiring parts 30, 26D, 26A and the primary inductor 21. Similarly, a drain bias voltage is supplied to the transistors 153 and 152 through the wiring parts 30, 26D, 26B and the primary inductor 22. A drain bias voltage is supplied to the transistors 155 and 154 through the wiring parts 30, 26D, 26C and the primary inductor 23.

In the case of the power amplifier according to Embodiments 1 and 2 corresponding to the transformer-based amplifiers of FIGS. 2 and 4, the number of the Vd terminals increases in proportion to the number n of the stages of transformers. As a result, the number of spots for wire bonding to the external power supply increases and the number of bonding wires increases. When the bonding wires cross or the external power supply circuit becomes complicated, the cost for packaging chips further goes up. This tendency is against the idea of reducing cost by CMOS. According to the power amplifier of Embodiment 3, by centrally providing the Vd terminal with use of wirings for coupling middle points of the primary inductors, chip packaging is simplified, contributing to reduction in the overall cost.

Another effect of the power amplifier of Embodiment 3 is to reduce the number of AC cut parts to be installed. When the whole power amplifier is performing an ideal differential operation, the middle point of the primary inductor to be coupled to the Vd terminal serves as a virtual AC ground. Therefore, there are few high-frequency signals leaking from the Vd terminal to the outside. However, when there occurs a shift in the differential operation, the middle point of the primary inductor does not serve as a virtual AC ground. In such a case, in order to prevent the leak of high-frequency signals from the Vd terminal, an external AC cut part such as a choke coil is sometimes coupled to the Vd terminal. According to the power amplifier of Embodiment 3, the Vd terminal can be centrally provided. Therefore, the number of necessary AC cut parts can be reduced.

Modification of Embodiment 3

Figure 23:
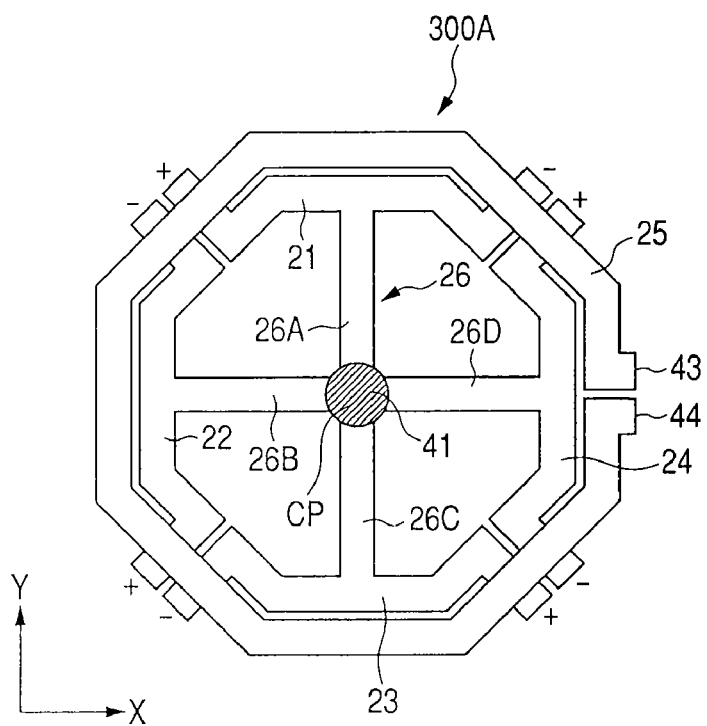
FIG. 23 is a plan view showing a configuration of a transformer 300A according to a modification of Embodiment 3 of the present invention.

FIG. 23 is a plan view showing a configuration of a transformer 300A according to a modification of Embodiment 3 of the present invention. The transformer 300A of FIG. 23 is different from the transformer 300 of FIG. 21 in that, in place of the wiring part 30 for applying Vd, it includes a pad 41 for applying Vd provided at the central point CP. Except for that point, the transformer 300A of FIG. 23 is identical to the transformer 300 of FIG. 21. Therefore, the same or corresponding parts are identified by the same reference characters and repetitive explanations thereof will be omitted.

Within a restriction on wire bonding, instead of providing the Vd terminal outside the transformer, the pad 41 may be arranged, as in FIG. 23, at the central point CP of the transformer 300A and this spot may be used as a Vd terminal. In this regard, if the electrical resistance (namely, the electrical resistance of wiring parts 26A to 26D) from the middle points of all the primary inductors 21 to 24 to the pad 41 being the Vd terminal is the same, the drain resistance of eight transistors 151 to 158 of FIG. 21 coupled to the primary inductors 21 to 24 can be made uniform. As a result, variation in operation of the whole transistors can be suppressed.

Further, the wiring part 30 of FIG. 21 is not provided in the transformer 300A. Therefore, the terminals 43 and 44 of the secondary inductor 25 can be provided closer to each other than in the case of the transformer 300 of FIG. 21. As a result, a distance between the primary inductor 24 and the secondary inductor 24 can be made longer, strengthening the magnetic coupling between the primary inductor 24 and the secondary inductor 25.

In the transformer 300 of FIG. 21, the Vd terminal is centrally provided. Accordingly, the drain current of DC (direct current) flows also in the wiring parts 26A to 26D for coupling the middle points of the primary inductors 21 to 24. Therefore, widths of the wiring parts 26A to 26D for coupling the middle points of the primary inductors have to be adjusted according to the magnitude of the flowing DC current. In particular, in the wiring part 25D of FIG. 21, DC currents (DC drain currents of the three differential pairs) of the primary inductors 21 to 23 gather through the wiring parts 26A to 26C. In the wiring part 30, DC currents for differential pairs coupled to the primary inductor 24 are further superposed. Since DC drain currents of four differential pairs flow there, wider wirings will be required. However, when the width of the wiring is made larger, the insertion loss of the transformer increases. Therefore, it is preferable to adjust the number of Vd terminals according to the magnitude of the insertion loss of the transformer.

On the contrary, in the transformer 300A of FIG. 23, a DC drain current of one differential pair alone flows in each of the wiring parts 26A to 26D. For example, to the transistors coupled to two ends of the primary inductor 21, a drain bias voltage is supplied through the wiring part 26A and the primary inductor 21. Therefore, the restriction on the width of wiring as in the case of the transformer 300 of FIG. 1 is alleviated. In particular, as in FIG. 23, when the respective distances between the'middle points of the primary inductors 21 to 24 and the pad 41 being the Vd terminal are equal, all of the widths of the wiring parts 26A to 26D may be the same.

In the transformer where the pad 41 is provided at the central point CP as in FIG. 23, it is conceivable that the profile of the transformer (namely, the circular profile formed by the primary inductors 21 to 24) is oblong (longer in the x-direction than in the y-direction in the drawing) or the profile of the transformer is vertically long (longer in the y-direction than in the x-direction in the drawing). In this case, by adjusting each line width of the wiring parts 26A to 26D and each line width of the primary inductors 21 to 24, resistance values of the supply paths of the bias voltages reaching respective transistors in FIG. 21 from the pad 41 can be made equal. As a result, the drain resistance of the eight transistors 151 to 158 of FIG. 21 can be uniform. Therefore, variation in the operation of the whole transistors can be suppressed.

The embodiments disclosed here are to be considered in all respects as illustrative and not restrictive. The scope of the invention is indicated by the appended claims rather than by the foregoing description and all changes which come within the meaning and range of equivalency of the claims are therefore intended to be embraced therein.

What is claimed is:

1. A power amplifier comprising:
   first and second primary inductors arranged as a whole in a circular geometry over a substrate;
   first and second amplifier pairs provided corresponding to the first and second primary inductors, respectively, each amplifier pair including first and second amplifiers coupled, respectively, to two ends of a corresponding primary inductor, said first and second amplifiers amplifying and outputting to the corresponding primary inductor first and second signals given as differential input signals,
   a secondary inductor provided adjacent to the first and second primary inductors and arranged in a circular geometry and being magnetically coupled to the primary inductors to make an output; and
   a connection wiring electrically coupling middle points of the first and second primary inductors with each other,
   wherein one of the two ends of the first primary inductor and one of the two ends of the second primary are arranged close to each other, and another of the two ends of the first primary inductor and another of the two ends of the second primary are arranged close to each other.

2. A power amplifier according to claim 1, wherein each of the middle points is a point over the primary inductor and also a point at the same distances from two ends of the primary inductor.

3. A power amplifier according to claim 1, wherein the connection wiring is provided inside the primary inductors.

4. A power amplifier according to claim 1, wherein the secondary inductor is a multiple turn inductor.

5. A power amplifier according to claim 1,
   wherein each of the first and second amplifiers has transistors operated by a drive voltage,
   wherein the drive voltage is supplied from an external device to a middle point of a first primary inductor which is one of the primary inductors,
   wherein the drive voltage is supplied to the transistors coupled to two ends of the first primary inductor through the first primary inductor, and
   wherein the drive voltage is supplied to the transistors coupled to two ends of a second primary inductor being different from the first primary inductor of the primary inductors through the connection wiring and the second primary inductor.

6. A power amplifier according to claim 1,
   wherein each of the first and second amplifiers has transistors operated by a drive voltage,
   wherein the drive voltage is supplied from an external device to a middle point of each of the primary inductors, and
   wherein the drive voltage is supplied to the transistors coupled to two ends of a first primary inductor of the primary inductors through the first primary inductor.

7. A power amplifier according to claim 6, further comprising a plurality of bypass capacitors coupled individually between the middle point of the respective primary inductors and a ground node.

8. A power amplifier according to claim 1, wherein one of the two ends of the first primary inductor and one of the two ends of the second primary are arranged opposite to each other in a direction where the connection wiring extends, and another of the two ends of the first primary inductor and another of the two ends of the second primary are arranged opposite to each other in a direction the where the connection wiring extends.

* * * * *